US009494618B2

(12) United States Patent
Preston et al.

(10) Patent No.: US 9,494,618 B2
(45) Date of Patent: Nov. 15, 2016

(54) DESIGNED ASPERITY CONTACTORS, INCLUDING NANOSPIKES, FOR SEMICONDUCTOR TEST USING A PACKAGE, AND ASSOCIATED SYSTEMS AND METHODS

(71) Applicant: Translarity, Inc., Fremont, CA (US)

(72) Inventors: Douglas A. Preston, McMinnville, OR (US); Morgan T. Johnson, Beaverton, OR (US)

(73) Assignee: Translarity, Inc., Fremont, CA (US)

( * ) Notice: Subject to any disclaimer, the term of this patent is extended or adjusted under 35 U.S.C. 154(b) by 0 days.

(21) Appl. No.: 13/843,690

(22) Filed: Mar. 15, 2013

(65) Prior Publication Data

US 2014/0179031 A1 Jun. 26, 2014

Related U.S. Application Data

(60) Provisional application No. 61/746,000, filed on Dec. 26, 2012.

(51) Int. Cl.
*G01R 31/28* (2006.01)
*G01R 1/073* (2006.01)
(Continued)

(52) U.S. Cl.
CPC ....... *G01R 1/07378* (2013.01); *G01R 1/06738* (2013.01); *G01R 1/06744* (2013.01);
(Continued)

(58) Field of Classification Search
CPC .................... H05K 1/147; H05K 1/189; H05K 2201/043; H05K 2201/056; H05K 1/0218; G01R 3/00; G01R 1/07307
(Continued)

(56) References Cited

U.S. PATENT DOCUMENTS 4,931,726 A * 6/1990 Kasukabe et al. ........ 324/755.05
5,177,439 A * 1/1993 Liu et al. .................. 324/750.05
(Continued)

FOREIGN PATENT DOCUMENTS

JP         2009282003 A    12/2009
KR    10-20060062824 A     6/2006
KR       20090132215 A    12/2009

OTHER PUBLICATIONS

International Search Report and Written Opinion issued on PCT/US2013/077684 and mailed on Apr. 30, 2014, 13 pages.
(Continued)

*Primary Examiner* — Alesa Allgood
(74) *Attorney, Agent, or Firm* — Christensen O'Connor Johnson Kindness PLLC

(57) ABSTRACT

Nanospike contactors suitable for semiconductor device test, and associated systems and methods are disclosed. A representative apparatus includes a package having a wafer side positioned to face toward a device under test and an inquiry side facing away from the wafer side. A plurality of wafer side sites are carried at the wafer side of the package. The nanospikes can be attached to nanospike sites on a wafer side of the package. Because of their small size, multiple nanospikes make contact with a single pad/solderball on the semiconductor device. In some embodiments, after detecting that the device under test passes the test, the device under the test can be packaged to create a known good die in a package.

16 Claims, 37 Drawing Sheets

(51) Int. Cl.
  *H01L 21/66* (2006.01)
  *G01R 1/067* (2006.01)
  *G01R 3/00* (2006.01)

(52) U.S. Cl.
  CPC ........... *G01R 31/2886* (2013.01); *H01L 22/14* (2013.01); *G01R 3/00* (2013.01); *H01L 2224/48091* (2013.01); *H01L 2224/73265* (2013.01); *H01L 2924/15311* (2013.01)

(58) Field of Classification Search
  USPC .................................................... 324/762.02
  See application file for complete search history.

(56) References Cited

U.S. PATENT DOCUMENTS

| | | | |
|---|---|---|---|
| 5,483,741 A * | 1/1996 | Akram ............... | G01R 1/06738 29/846 |
| 5,592,736 A | 1/1997 | Akram et al. | |
| 5,635,846 A * | 6/1997 | Beaman et al. ......... | 324/756.03 |
| 6,245,445 B1 | 6/2001 | Lykins, II | |
| 7,547,850 B2 * | 6/2009 | Kirby et al. ................. | 174/260 |
| 7,755,178 B2 * | 7/2010 | Hagen ................. | H01L 23/4985 257/686 |
| 2002/0130676 A1 * | 9/2002 | Beaman et al. ............... | 324/754 |
| 2004/0056298 A1 * | 3/2004 | Stone ................ | H01L 23/49805 257/308 |
| 2005/0042932 A1 | 2/2005 | Mok et al. | |
| 2007/0063721 A1 | 3/2007 | Dozier, II | |
| 2007/0090855 A1 * | 4/2007 | Wark ............................ | 324/765 |
| 2007/0099410 A1 | 5/2007 | Sawyer et al. | |
| 2007/0231960 A1 * | 10/2007 | Pavier et al. .................. | 438/106 |
| 2009/0066352 A1 * | 3/2009 | Gritters et al. ................ | 324/755 |
| 2009/0309238 A1 | 12/2009 | Loke | |
| 2010/0044860 A1 * | 2/2010 | Haba et al. .................... | 257/737 |
| 2010/0078799 A1 * | 4/2010 | Zarbock .............. | B81C 1/00269 257/690 |
| 2012/0119359 A1 * | 5/2012 | Im ..................... | H01L 23/49811 257/737 |
| 2012/0313659 A1 * | 12/2012 | Hsu ......................... | 324/755.05 |
| 2013/0135001 A1 * | 5/2013 | Breinlinger .............. | 324/754.03 |

OTHER PUBLICATIONS

International Search Report and Written Opinion issued on PCT/US20143/077680 and mailed Apr. 24, 2014, 12 pages.

* cited by examiner

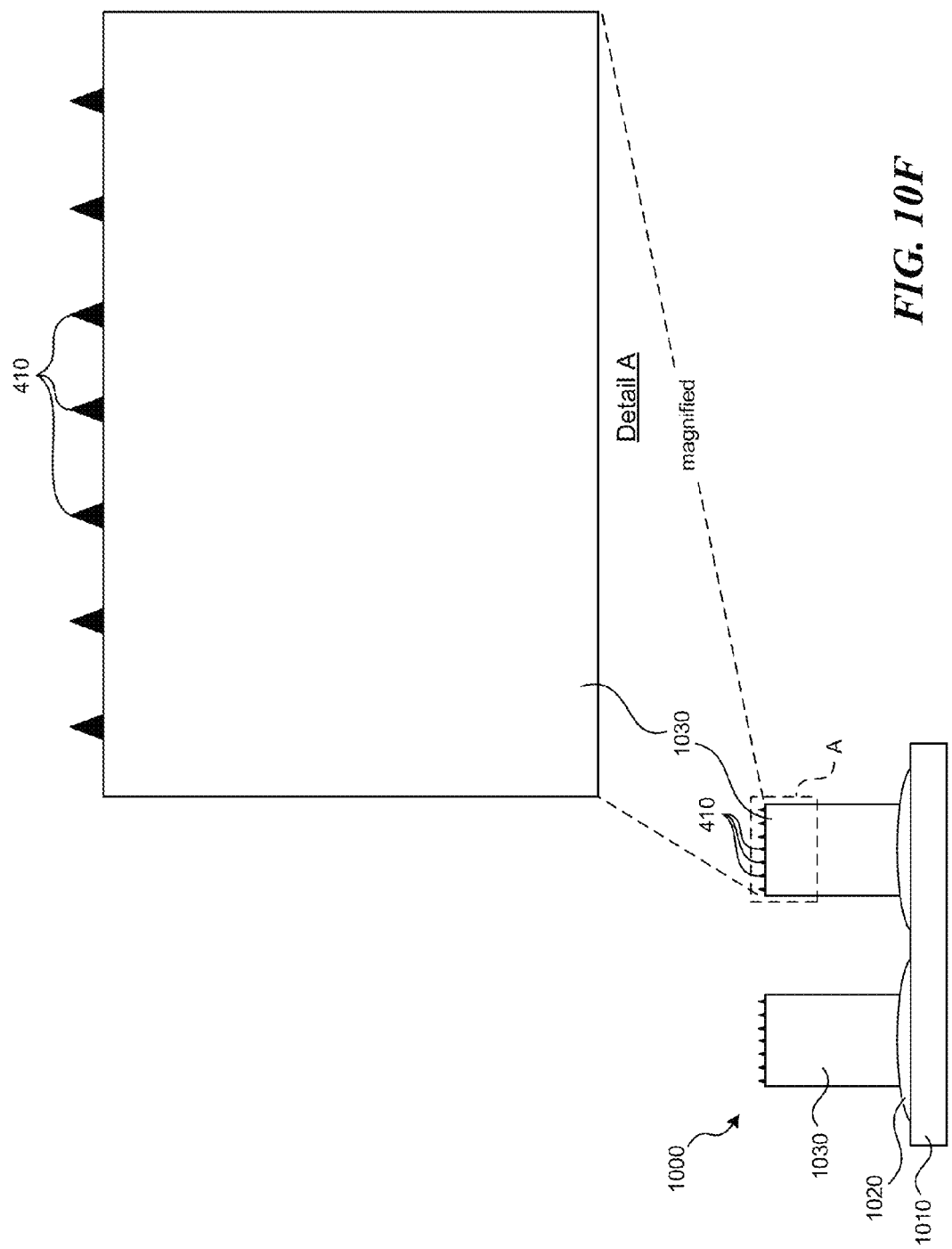

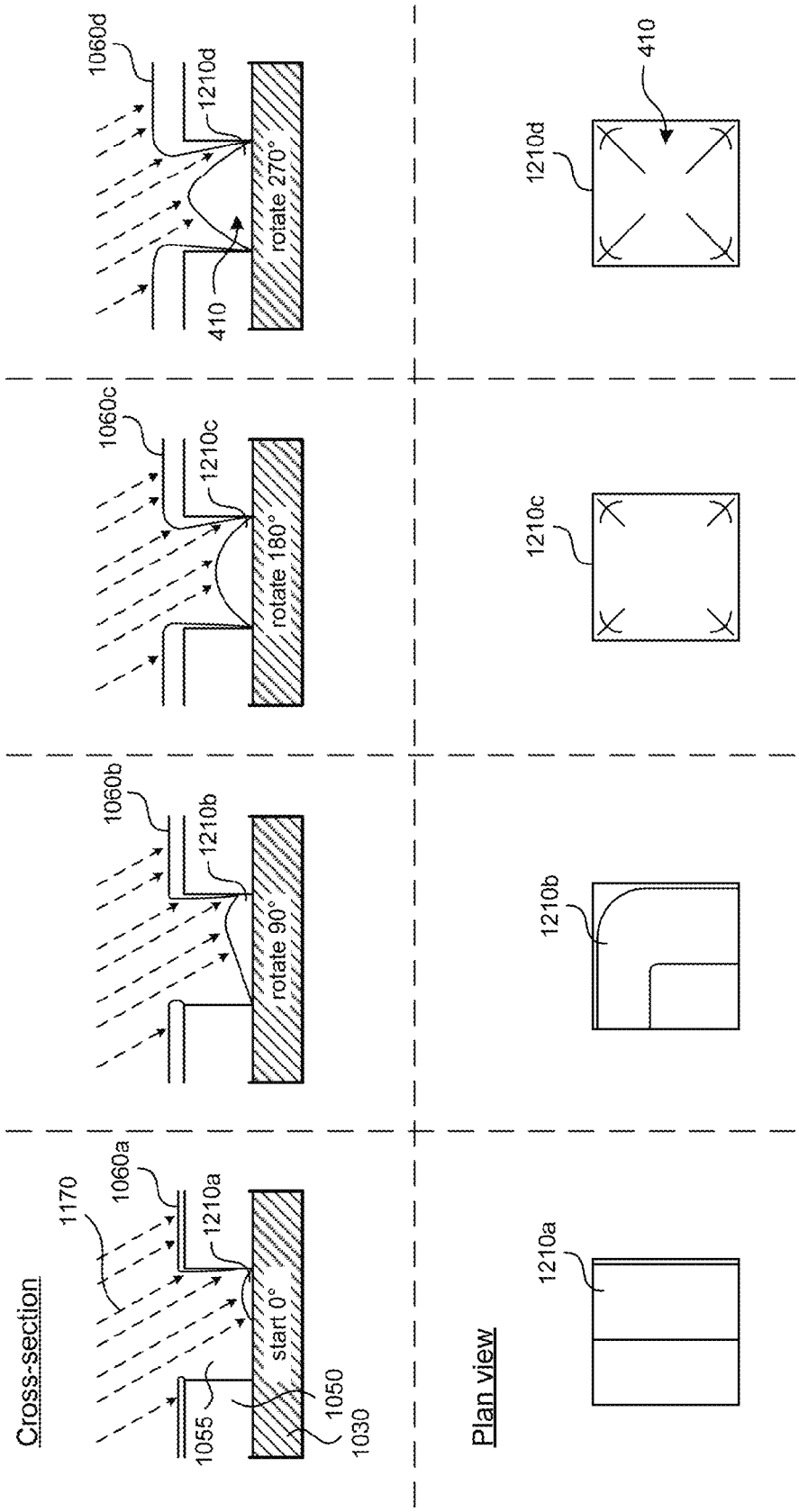

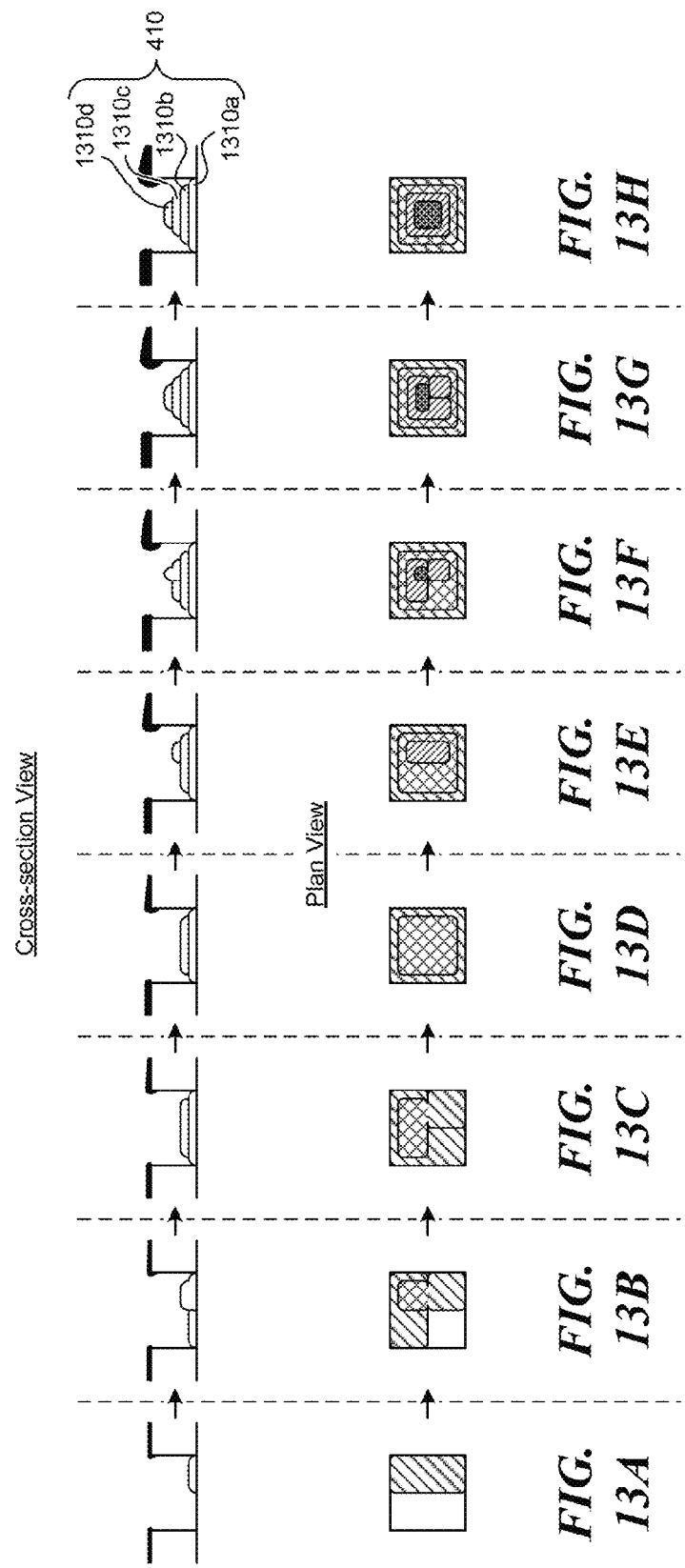

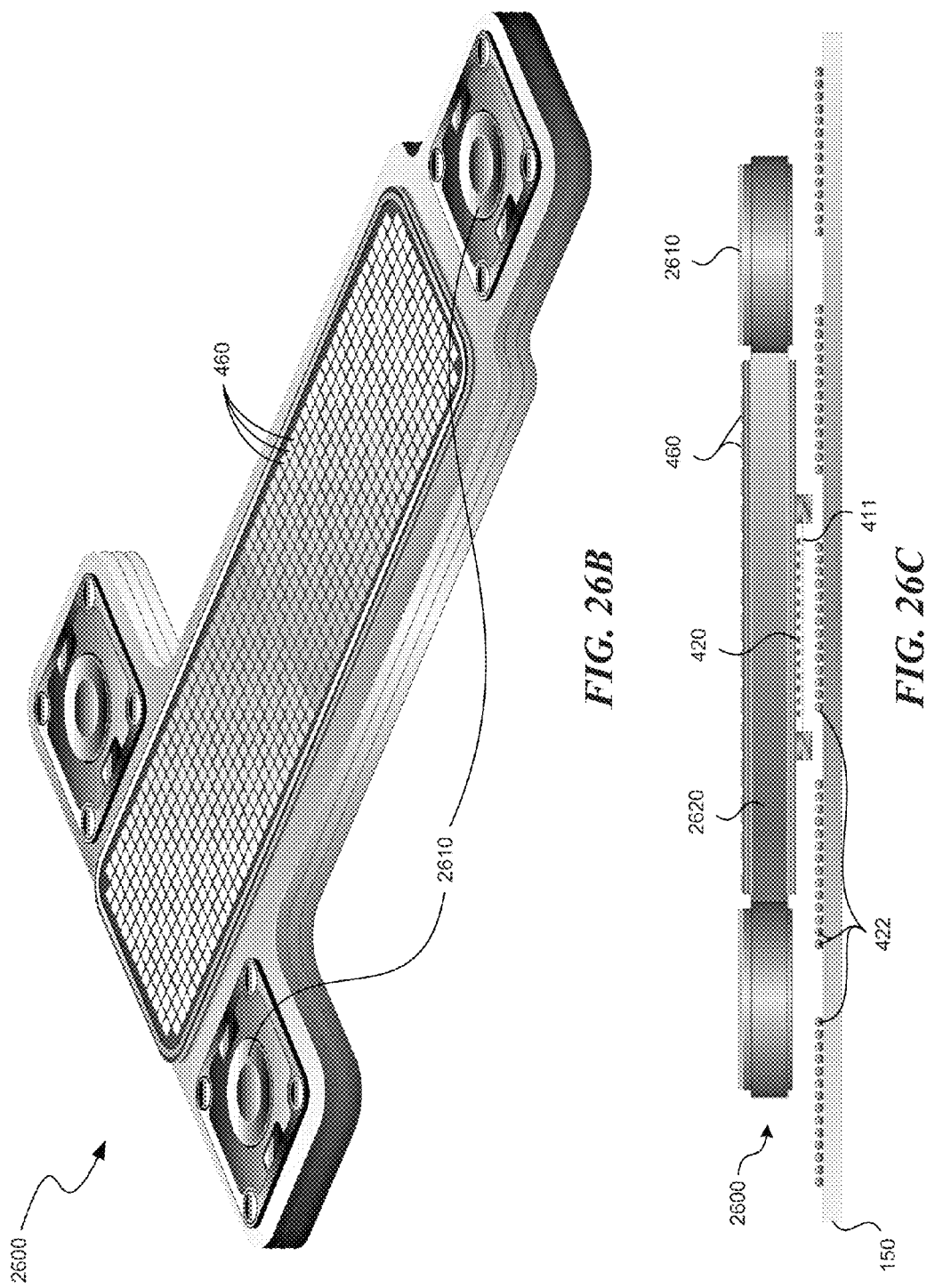

DESIGNED ASPERITY CONTACTORS, INCLUDING NANOSPIKES, FOR SEMICONDUCTOR TEST USING A PACKAGE, AND ASSOCIATED SYSTEMS AND METHODS

CROSS-REFERENCE TO RELATED APPLICATION

The present application claims priority to U.S. Provisional Application No. 61/746,000 filed on Dec. 26, 2012, which is incorporated herein by reference. To the extent the foregoing application and/or any other materials incorporated herein by reference conflict with the present disclosure, the present disclosure controls.

TECHNICAL FIELD

The present technology is directed generally to designed asperity contactors, including nanospikes, that are used with packagescapable of contacting pads or solderballs on a semiconductor device, and associated systems and methods.

BACKGROUND

Integrated circuits are used in a wide variety of products. Integrated circuits have continuously decreased in price and increased in performance, becoming ubiquitous in modern electronic devices. These improvements in the performance/cost ratio result, at least in part, from miniaturization, which enables more semiconductor dies to be produced from a wafer with each new generation of the integrated circuit manufacturing technology. Furthermore, the total number of the signal and power/ground contacts on a die generally increases with new, more complex die designs. An increased number of contacts on a die (e.g., pads or solderballs) over a decreased size of the die necessitates smaller contacts.

Prior to shipping an integrated circuit die to a customer, the performance of the integrated circuit is tested, either on a statistical sample basis or by testing each die. An electrical test of a semiconductor die typically includes powering the die through the power/ground connectors, transmitting signals to the die input (I) connectors, and measuring the resulting signals at the die output (O) connectors. Therefore, during the integrated circuit test at least some connectors on the die must be electrically contacted to connect the die to a source of power and a source of the test signals.

FIG. 1A is a side view of a conventional test contactor 10a in contact with a semiconductor device 10b (e.g., a device under test). The semiconductor device 10b can include a packaged die 12 attached to a die substrate 18 with a die attach material 16. Wirebonds 14 provide electrical connections between circuits in the die 12 and solderballs 20 (or pads or other contact structures) that provide communication between the die 12 and other devices. The solderballs 20 also provide communication between the die 12 and the test contactor 10a. As shown in FIG. 1A, the test contactor 10a has an array of spring-loaded pins 22 between a contactor substrate 26 and the solderballs 20. As the contactor substrate 26 moves downwardly toward the semiconductor device 10b, the pins 22 make contact with the solderballs 20. When the contactor substrate 26 moves further toward the semiconductor device 10b or the semiconductor device 10b moves toward the contactor substrate 26, the springs of the pins 22 compress, producing increased contact forces between the pins 22 of the contactor 10a and the solderballs 20 of the semiconductor device 10b. In general, the contact forces should be high enough to allow the pins 22 to break through an oxide layer on the pads/solderballs (e.g., the contact structures), but not so high as to damage the pads/solderballs. This may be a difficult requirement for the conventional spring loaded pins 22 because they tend to produce high contact forces, thus penetrating through the oxide layer on the pads/solderballs 20, but also possibly damaging the contacts on the die. Furthermore, for a large number of pads/solderballs 20, the total contactor force can quickly become very high, thus requiring powerful mechanisms to compress the contactor 10A.

FIG. 1B illustrates several designs for commercially available spring loaded pins positioned in a compressed state. In one example, a pin 22a has a pair of cylindrical, male/female pin segments 40a/41a that can slide relative to each other along a common centerline. As the contactor substrate (shown in FIG. 1A) pushes the female pin segment 41a toward the solderball 20a, a spring 32a becomes compressed between a shoulder 38a on the female pin segment 41a and a shoulder 36a on the male pin segment 40a. The contact force between a crown tip 34a and the solderball 20a increases generally linearly with the compression of spring 32a.

In another spring loaded pin design, also shown in FIG. 1B, a pin 22b includes a spring 32b that is compressed between a shoulder 36b on a pin segment 40b and the connector substrate (shown in FIG. 1A). The pins 22a/22b typically have either a crown tip 34a or a pointed tip to facilitate breaking through the oxide layer over the solderballs 20a or pads 20b respectively. The range of compression for the springs 32a/32b is ultimately limited either by a full compression of the springs or by the force provided by a compression mechanism. The individual pins are arranged in a contactor that keeps the pins aligned in a proper layout, as explained below with reference to FIG. 1C.

FIG. 1C is a bottom view of the contactor 10a used for contacting the semiconductor device 10b (shown in FIG. 1A). The contactor 10a has a two dimensional array of pins 22 corresponding to the array of contact structures on the packaged device under test. The pins 22 protrude through a perforated mask 46. The contactor substrate 26 mechanically supports one end of the pins 22 while the opposite ends of the pins 22 engage with the device under test. Alignment features 44a-b can align the device under test and the contactor 10a. The contactor substrate 26 also provides electrical signals to the pins 22. A characteristic diameter of the pins 22 generally scales with a characteristic dimension of the contact structures on the semiconductor die or the package. Therefore, as the contact structures on the die become smaller and/or have a smaller pitch, the pins must become smaller, too. It is difficult to significantly reduce the diameter and pitch of the spring loaded pins, however, because of the difficulties in machining and assembling such small parts, which in turn can cause inconsistent performance from one assembly to another.

FIG. 2A is an isometric view of a test contactor 10c suitable for a bare die test (i.e., suitable for testing unpackaged dies). The test contactor 10c has a two-dimensional array of flexible needles 52 carrying needle blades 54 and corresponding to the layout of the pads/solderballs on the die under test. The flexible needles 52 can be curved to provide springiness when the needle blades 54 engage with the corresponding pads/solderballs on the die. The opposite ends of the flexible needles 52 are mechanically and electrically connected with a substrate 56 and further to a source of signals and/or power/ground. As the needle blades 54 engage with the corresponding pads/solderballs, the needle blades may slide over the surface of the pads/solderballs. This sliding action, coupled with a relatively high stiffness of the flexible needles 52, typically works well to break the oxide layer on the pads/solderballs, but it can also cause penetration damage, as illustrated in FIG. 2B described below.

FIG. 2B is a top view of a solderball 22 after undergoing the test described with reference to FIG. 2A. As shown in FIG. 2B, the pressure and/or sliding action of the needle blade 54 produced a depression 62 in the solderball 22. Such an undesired depression can be exacerbated by repetitive tests requiring multiple contacts or "touchdowns" between the needles 52 and the contact structures on the device. Repetitive tests are common with, for example, devices that marginally pass or fail an initial test (therefore requiring additional testing), devices placed close to a wafer edge (therefore undergoing multiple contacts due to a contactor design that does not allow for an overhang over the wafer edge), devices subjected to multiple test suites using different testers (therefore also requiring multiple contacts), etc. Furthermore, conventional test contactors have relatively high electrical resistances, which limits their ability to test high current devices. Accordingly, there remains a need for cost effective test contactors that do not damage the contact structures on the die and that can scale down in size with the contact structure size and pitch, while being capable of delivering high electrical currents.

Many semiconductor dies undergo testing prior to die singulation (i.e., testing is performed on the wafer) as well as after being packaged. Testing the semiconductor dies on the wafer helps in eliminating as many out-of-spec devices prior to investing more money and time in their singulation and packaging. However, in some cases the devices cannot be fully tested while on the wafer. For example, with high speed devices the I/O frequencies and power delivery may be too high for the typically long and slender needles 52 having high inductance and/or resistance. Therefore, in many cases after the die singulation and packaging, the packaged devices are tested again to verify performance at higher frequencies and higher power consumption. Some packaged devices may fail the test even though they passed the lower frequency/power test on the wafer. This process increases the overall manufacturing cost not only because the device was tested twice, which carries a cost penalty by itself, but also because when a packaged device fails, both the die and the package must be discarded. Thus, the package cost of the failed device cannot be recovered, which further increases the cost of testing. Accordingly, there remains a need for the test contactors that can test devices on the wafer at increased I/O frequencies and power to reduce or minimize additional testing of the packaged devices.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Furthermore, in the drawings, like reference numerals designate corresponding parts throughout the several views.

FIGS. 10A-10G are schematic illustrations of a manufacturing process for a nanospike contactor in accordance with the presently disclosed technology.

FIGS. 12A-12D are schematic diagrams of a nanospike manufacturing process in accordance with an embodiment of the presently disclosed technology.

FIGS. 13A-13H are schematic diagrams of a nanospike manufacturing process in accordance with another embodiment of the presently disclosed technology.

FIGS. 26A-26C are isometric views of a mechanism suitable for reshaping the solderball using a nanospike based contactor in accordance with the present technology.

DETAILED DESCRIPTION

Figure 1A:
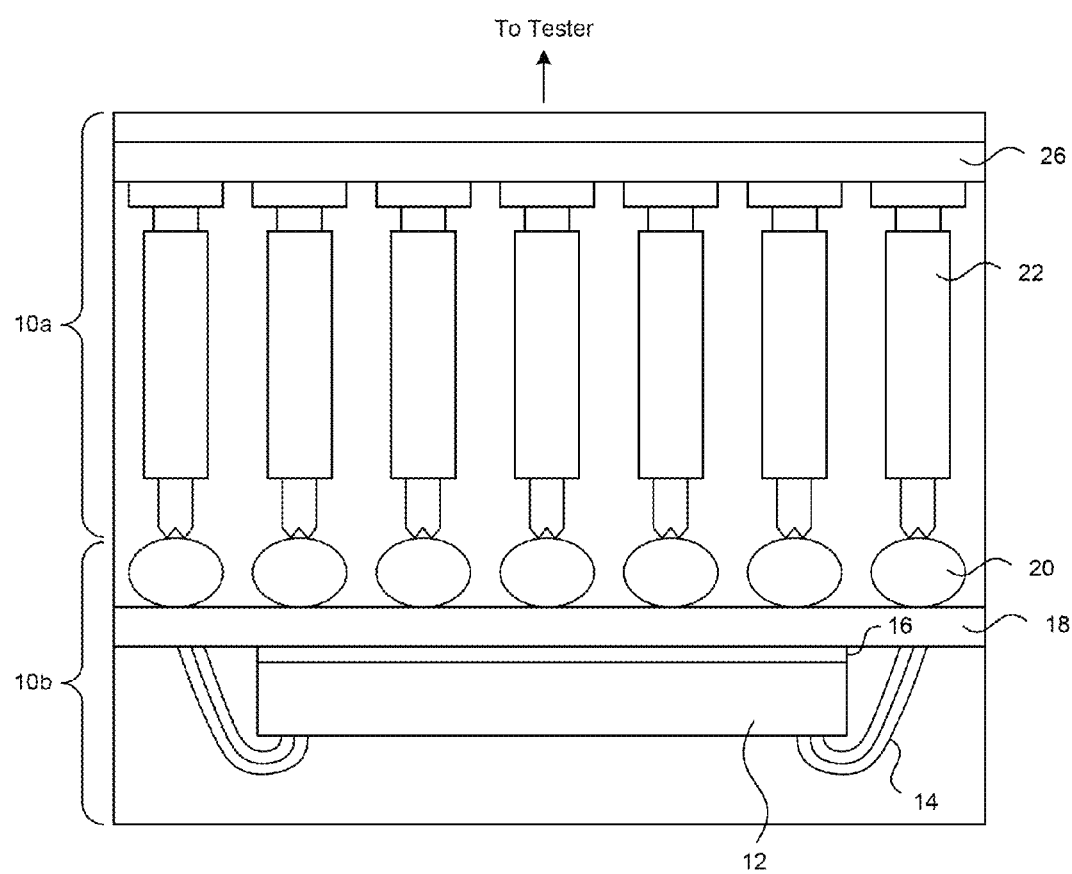
FIG. 1A is a partially schematic, side view of a packaged semiconductor device undergoing a test in accordance with the prior art.
Figure 1B:
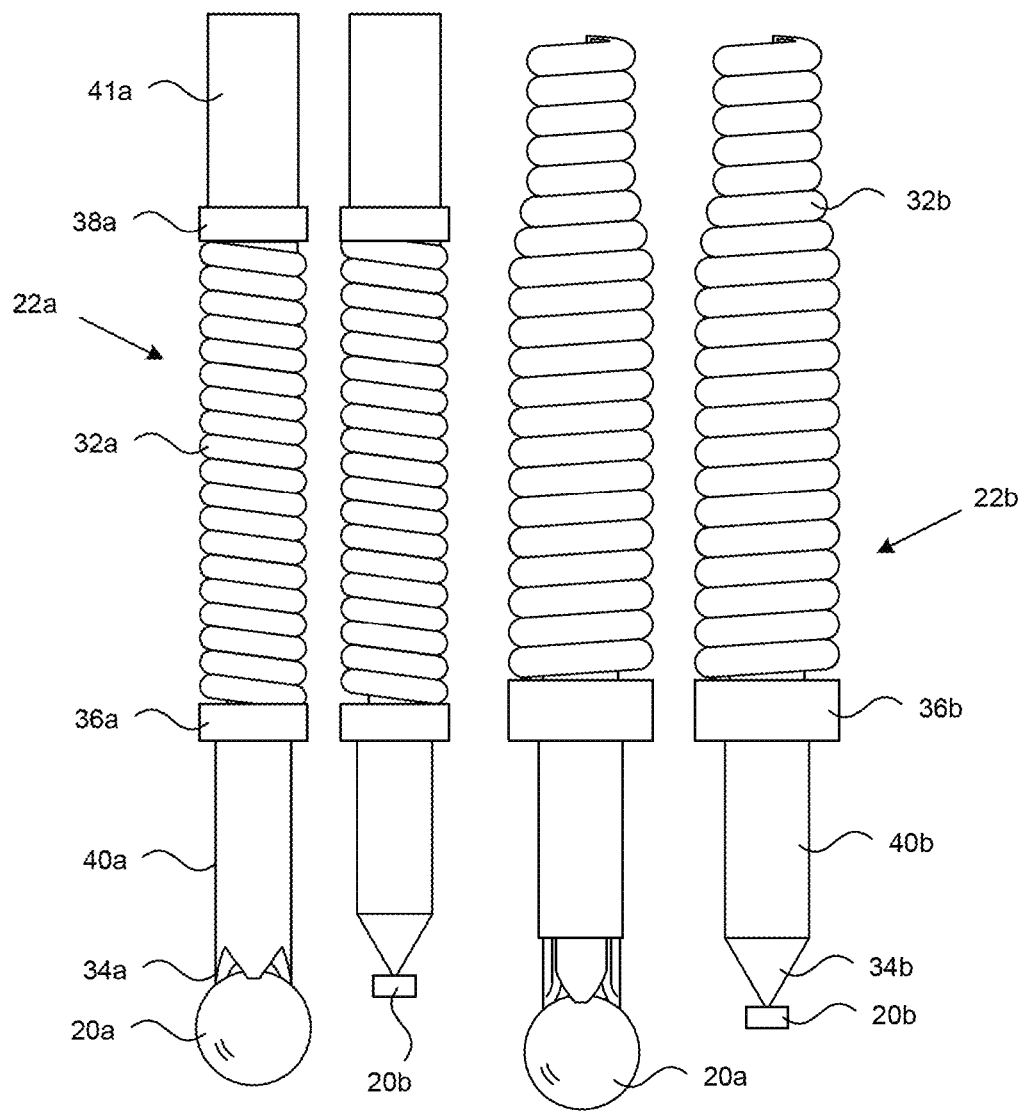
FIG. 1B is a partially schematic, side view of several representative pin designs in accordance with the prior art.
Figure 1C:
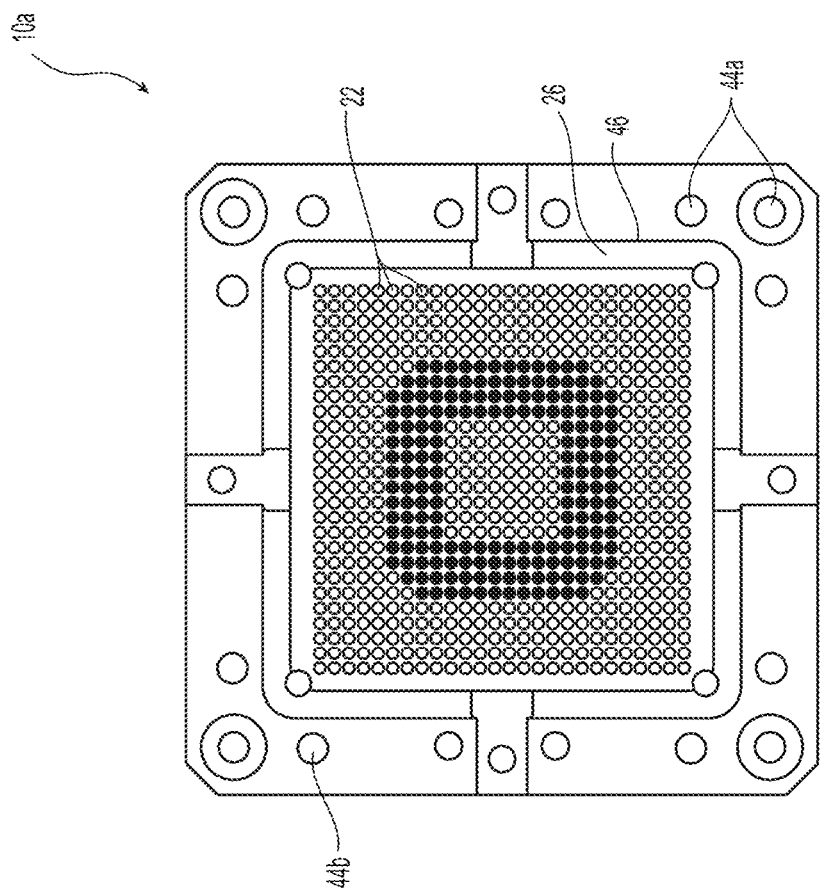
FIG. 1C is a top view of a prior art contactor.
Figure 2A:
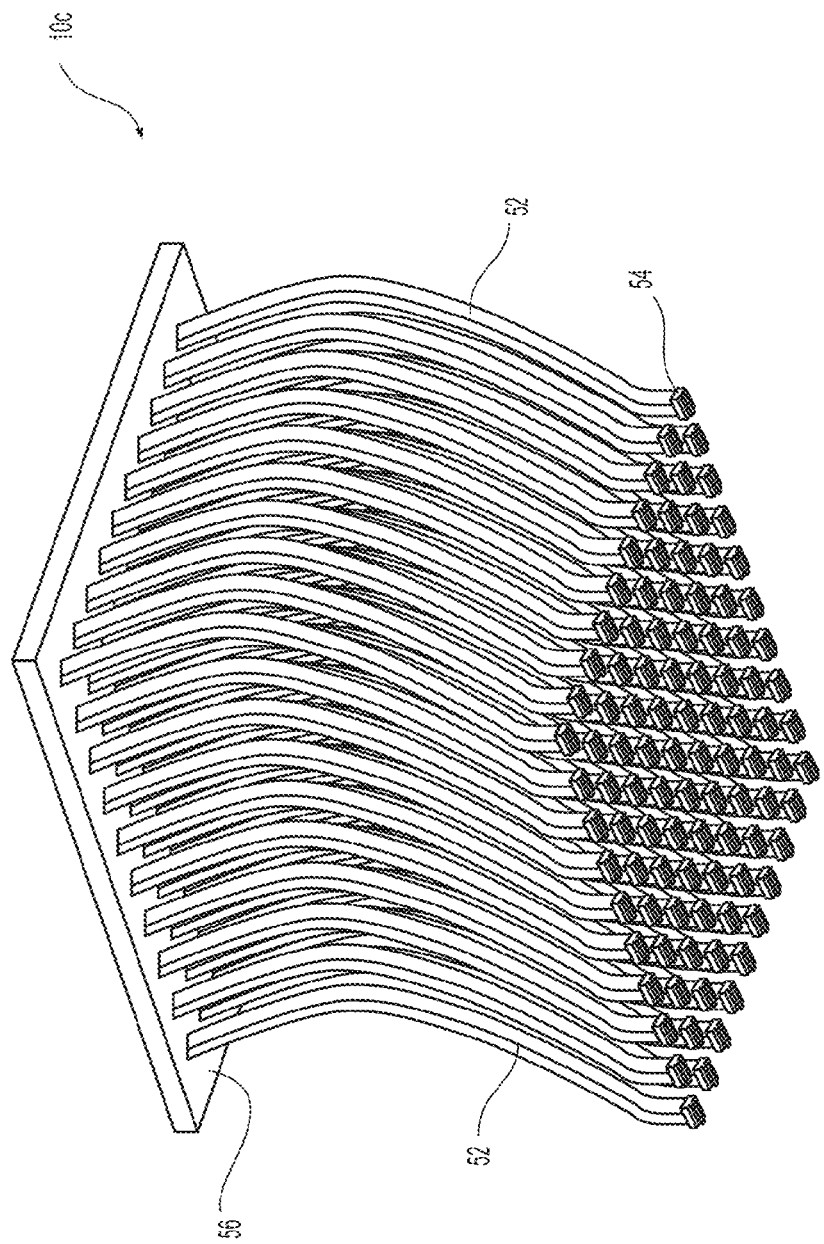
FIG. 2A is a partially schematic, isometric view of a bare die contactor in accordance with the prior art.
Figure 2B:
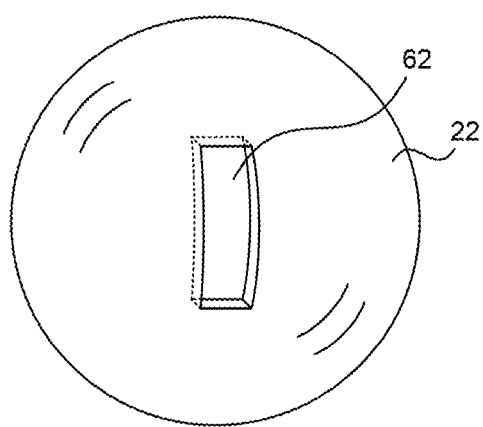
FIG. 2B is an isometric illustration of solderball damage caused by a prior art contactor.

Specific details of several embodiments of representative designed asperity contactors and associated systems and methods for manufacture and use are described below. The contactors can be used for testing bare semiconductor dies on a wafer, and/or packaged semiconductor dies. The contactors can be used for testing different types of semiconductor devices including, for example, memory devices, logic devices, light emitting diodes, micro-electro-mechanical-systems, and/or combinations of these devices. A person skilled in the relevant art will also understand that the technology may have additional embodiments, and that the technology may be practiced without several of the details of the embodiments described below with reference to FIGS. 3-26*c*.

Briefly described, methods and devices for testing bare and packaged semiconductor dies are disclosed. The disclosed methods and systems enable operators to test devices having pads, solderballs and/or other contact structures that have a small size and/or pitch. Solderballs, pads and/or other suitable conductive elements are collectively referred to herein as "contact structures." In many embodiments, the technology described in the context of one or more type of contact structures can also be applied to others. In contrast with the conventional contact structures, the designed asperities can be significantly smaller than the corresponding contact structures on the device under test. Unless otherwise noted, the term designed asperities is used herein to encompass designed non-uniformities (e.g., deliberately formed structures that are small, but are not simply surface roughness that may form as a fallout from a manufacturing process). Accordingly, designed asperities have a scale that is substantially smaller than the scale of the corresponding pad/solderball of the device it contacts (e.g., device under test) and can be formed in a controlled, repeatable process, e.g., to maintain consistent properties and performance from one batch to another. Such asperities include, but are not limited to, nanospikes. Accordingly, while representative examples of the present technology are described below in the context of nanospikes, the technology is not limited to nanospikes and can instead include other design asperities.

Designed asperities, nanospikes, subscale penetrating structures and/or other structures performing similar functions can be tailored for the metal, surface finish, and/or pitch of the contact structures contacted to improve (e.g., optimize) electrical contact and/or reduce (e.g., minimize) damage to the contact structures. Because the nanospikes are much smaller than conventional contact structures, the damage to the contact structures is reduced or eliminated, even if the device is contacted repeatedly. The designed asperities, e.g., the nanospikes, are engineered and manufactured to possess a high degree of regularity, as opposed to naturally occurring roughness on the surface of solid materials. In some embodiments, a high degree of size uniformity and a smoothness of surface of the nanospikes can reduce or minimize of the tendency for contact materials to stick to the nanospikes, even when the nanospikes repeatedly penetrate into the contacts. In general, the contact force can be smaller because nanospikes displace a smaller amount of material by a smaller distance than do conventional test devices. In at least some embodiments, the multiple nanospikes transmit electrical current to a pad/solderball with less resistance and therefore less current constriction than does a single, larger contact point associated with the conventional technology. Since the contact resistance between the nanospikes and corresponding pad/solderball is, at least in the first order of approximation, inversely proportional to the total contact area, the nanospikes can produce a relatively low contact resistance due to the large combined contact area provided by the multiple nanospikes contacting corresponding pad/solderball. Similarly, the electrical resistance of the nanospike-based contactors is proportional to the ratio of the cross sectional area of the nanospikes and their electrical conductivity, and is inversely proportional to the length of the nanospikes. Due to the small length of the nanospikes and high total cross-sectional area provided by multiple nanospikes, the electrical resistance of the nanospike-based contactors can be acceptable even with the nanospike material having a relatively low intrinsic electrical conductivity. Consequently, some materials that are not suitable for the conventional contactors due to their poor electrical conductivity may be suitable as a nanospike material. In some embodiments, the nanospikes can be about 0.3-2 μm long. In other embodiments, the nanospikes can be about 50-200 nm long, making them suitable for the manufacturing process based on e-beam lithography. Other sizes of the nanospikes, for example smaller than 50 nm and bigger than 2 μm are also possible. In at least some embodiments, the relatively small length of the nanospikes limits the penetration of the nanospikes through the pads on a device under test, thus protecting the dielectric layer that is typically located under the pad. Much greater pressure would be required for the nanospikes to further penetrate through the dielectric layer than to simply penetrate into the solder and/or the pad material. Since multiple nanospikes are distributed over a wafer side contact pad of a translator, the alignment between the pad/solderball of a device under test and the wafer side contact pad of the translator is more robust (e.g., more tolerant of mis-alignments and/or temperature excursions) than is the alignment associated with conventional methods that use a single, larger spring-loaded pin for contacting the pad/solderball. In some embodiments, the nanospikes can be used on the inquiry-side contact pads of the wafer translator in addition or in lieu of using the nanospikes on the wafer side contact pads. Consequently, in at least some embodiments, the current carrying capability, alignment and/or repeatability of the tests conducted with contactors that include nanospike technology are improved when compared with conventional technology. Furthermore, in at least some embodiments, an inventive device package can be used as a translator to test dies on the wafer. The device package can have nano-spikes on the wafer-side pads for contacting the solderballs of the dies on the wafer. In at least some embodiments, due to the high I/O frequency and current carrying capabilities of the package, the device under test can be tested sufficiently such that no additional post-packaging testing is needed. In some embodiments of the technology, such a device under test that successfully passed the test can be packaged while still on the wafer by melting its solderballs and/or nanospikes, thus reducing the need for the subsequent processing of the device. In some embodiments, the translator can be used to reshape the solderballs by, for example, making their heights uniform using high pressure. Better solderball height uniformity can result in higher test and packaging yields because the electrical/mechanical contacts with the corresponding package contacts are improved.

Figure 3:
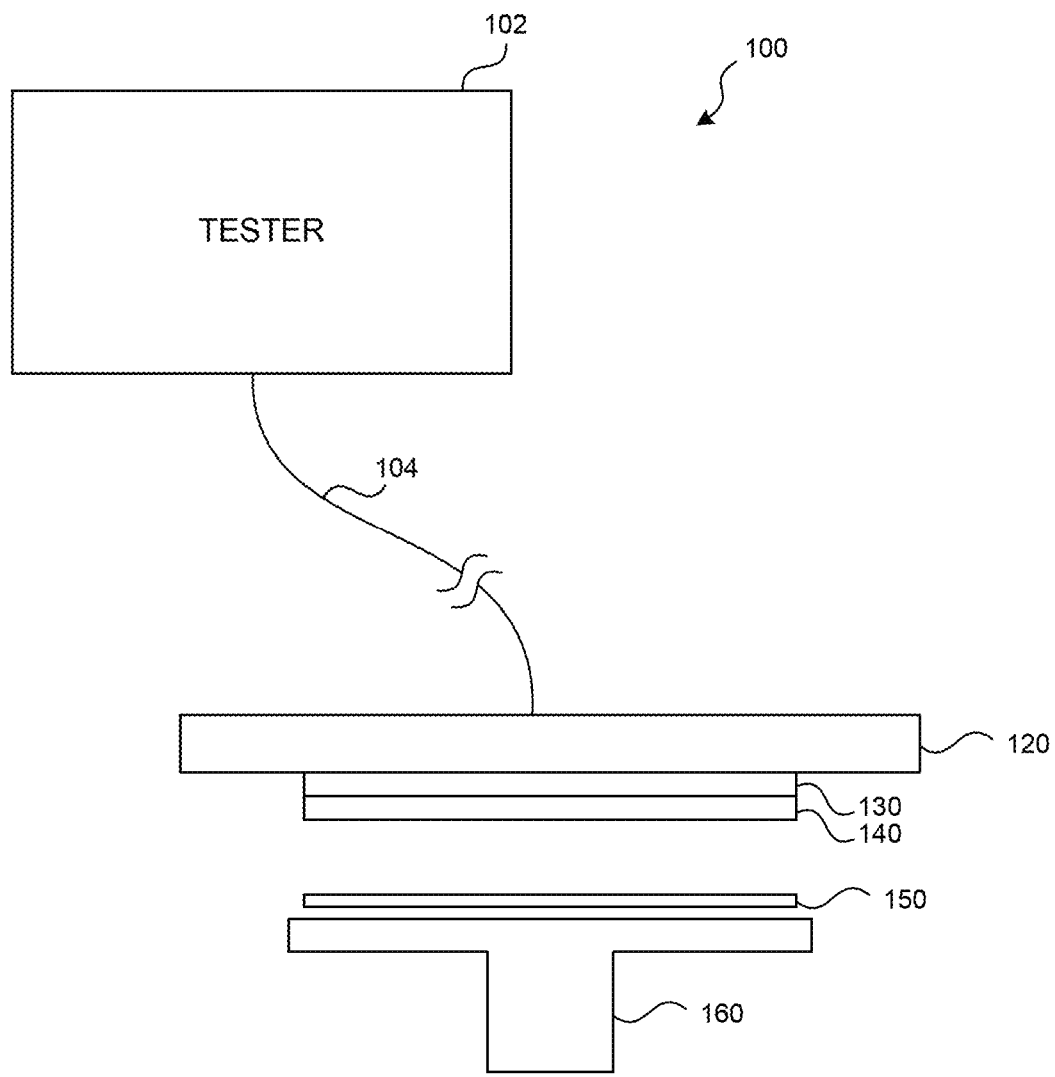
FIG. 3 is a schematic view of a translator stack in accordance with an embodiment of the presently disclosed technology.
Figure 4:
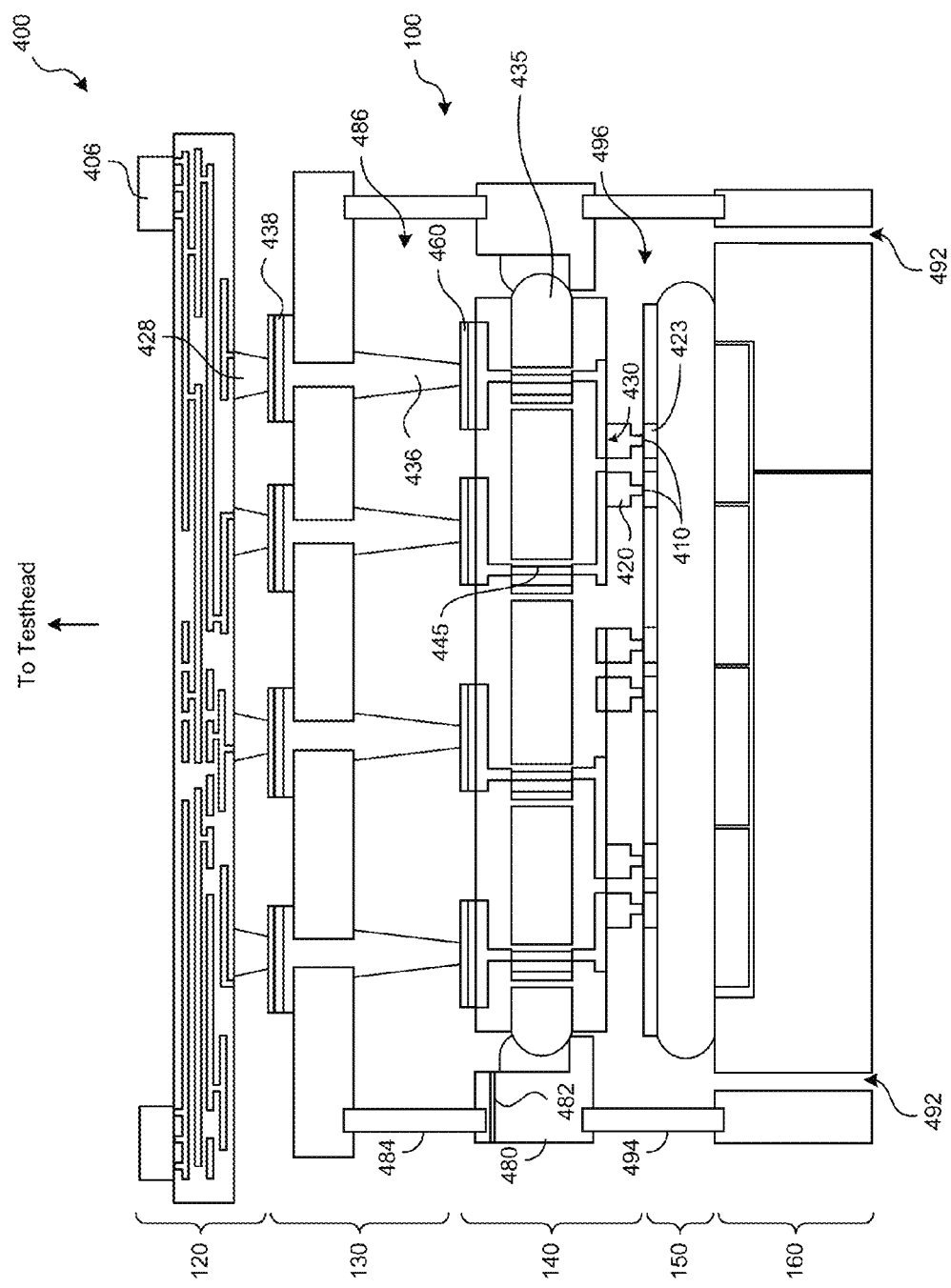
FIG. 4 is a partially schematic, side view of a translator stack in accordance with another embodiment of the presently disclosed technology.

FIGS. 3 and 4 illustrate a translator system 100 configured in accordance with embodiments of the presently disclosed technology. FIG. 3 is a schematic side view of the translator system 100. The overall system 100 can include a tester 102 that transmits signals and power to one or more dies on a wafer 150. The tester 102 can also measure, analyze and store the return signals from the device under test to determine its quality. The wafer 150 is supported by a wafer chuck 160, which can also provide thermal control and precise positioning for the wafer. The signals and power from the tester 102 pass through a tester cable 104 to a device interface board 120, which may be a printed circuit board with an appropriate routing arrangement to distribute the signals and power to required locations on a wafer-facing side of the printed circuit board. In addition or in lieu of the tester cable 104, the tester 102 (or some parts of it) can dock directly to the device interface board 120 through suitably distributed pairs of connectors. The device interface board 120 can electrically and mechanically connect to an interposer board 130, which, in turn, can precisely dock with a translator 140 to distribute the signals and power to the translator. In some embodiments of the present technology, the translator 140 has larger contact pads facing the interposer board 130 (e.g., inquiry side contact pads of the translator) and smaller contact pads facing the wafer 150 (e.g., wafer side contact pads of the translator). In at least some embodiments of the present technology, larger inquiry side contact pads on the translator 140 facilitate contact with the pins of the interposer board 130. The smaller wafer side contact pads and/or pins of the translator 140 correspond to the finer pitch and size of the pads/solderballs on the wafer 150.

FIG. 4 is a side view of selected elements of the translator system 100 of FIG. 3. Many features of FIG. 4 are not shown to scale for purposes of illustration. The system 100 can include a translator stack 400 that in turn includes the device interface board 120, the interposer board 130 and the translator 140 connected to an active side of the wafer 150. The wafer chuck 160 supports the opposite, non-active side of the wafer 150. Starting from the top of the stack 400, the device interface board 120 can have interface board connectors 406 for interfacing with the tester or tester cable (not shown). The signals and power from the tester can be distributed to interface board pins 428 facing corresponding contacts 438 on the interposer board 130. In other embodiments, the interposer board 130 can have pins facing corresponding contacts of the device interface board 120, or other suitable connection arrangements. In any of these embodiments, the interposer board 130 can be aligned relative to the translator 140, e.g., using a support ring 480. In some embodiments of the present technology, a space 486 between the interposer board 130 and the translator 140 can be at least partially evacuated, e.g., through openings 482 to provide good mechanical contact between interposer pins 436 of the interposer board 130 and the inquiry side contact pads 460 of the translator 140. Seals 484 can be configured to maintain the vacuum between the interposer board 130 and the translator 140. In other embodiments, the contact between the interposer board 130 and the translator 140 can be provided by, for example, mechanical clamps or other suitable devices.

The inquiry side contact pads 460 on the inquiry side of the translator 140 are electrically connected to corresponding wafer side contact pads 430 using traces 445. The relatively large size of the inquiry side contact pads 460 facilitates alignment with the interposer pins 436, while on the opposite side of the translator 140, the relatively small size of the wafer side contact pads 430 corresponds to the smaller pads/solderballs (e.g., contact structures 423) on the wafer. Traces 445 in a translator board 435 electrically connect the inquiry side pads to the wafer side contact pads.

In some embodiments of the present technology, the wafer side contact pads 430 include nanospike elements (e.g., nanospikes 410) that can be carried by nanospike pads 420. In other embodiments, the nanospikes 410 can be attached to or formed integrally with the contact pads 430 without the intermediary nanospike pads 420. In any of these embodiments, the nanospikes can improve the electrical and/or mechanical contact between the translator 140 and the wafer 150 by having a vacuum in a space 496 between the translator 140 and the wafer 150, e.g., via openings 492. Seals 494 can be positioned around the space 496 to maintain the vacuum in the space 496 between the translator 140 and the wafer 150.

The translator 140 can be aligned with the wafer 150 via the wafer chuck 160, since the wafer is aligned and secured against the wafer chuck. In certain embodiments, the wafer 150 and the wafer translator 140 can be removeably attached by systems and methods described in U.S. patent application Ser. No. 12/547,418, assigned to the assignee of the present application, filed on Aug. 25, 2009, and entitled "Maintaining a Wafer/Wafer Translator Pair in an Attached State Free of a Gasket Disposed Therebetween," which is hereby incorporated by reference in its entirety. In other embodiments, the translator and wafer can be kept in contact by a mechanical clamping device or other suitable devices. The alignment and vacuum between the inquiry side of the translator 140 and the wafer 150 pulls the nanospikes in contact with contact structures of the wafer 150, as described further below with reference to FIG. 5.

Figure 5:
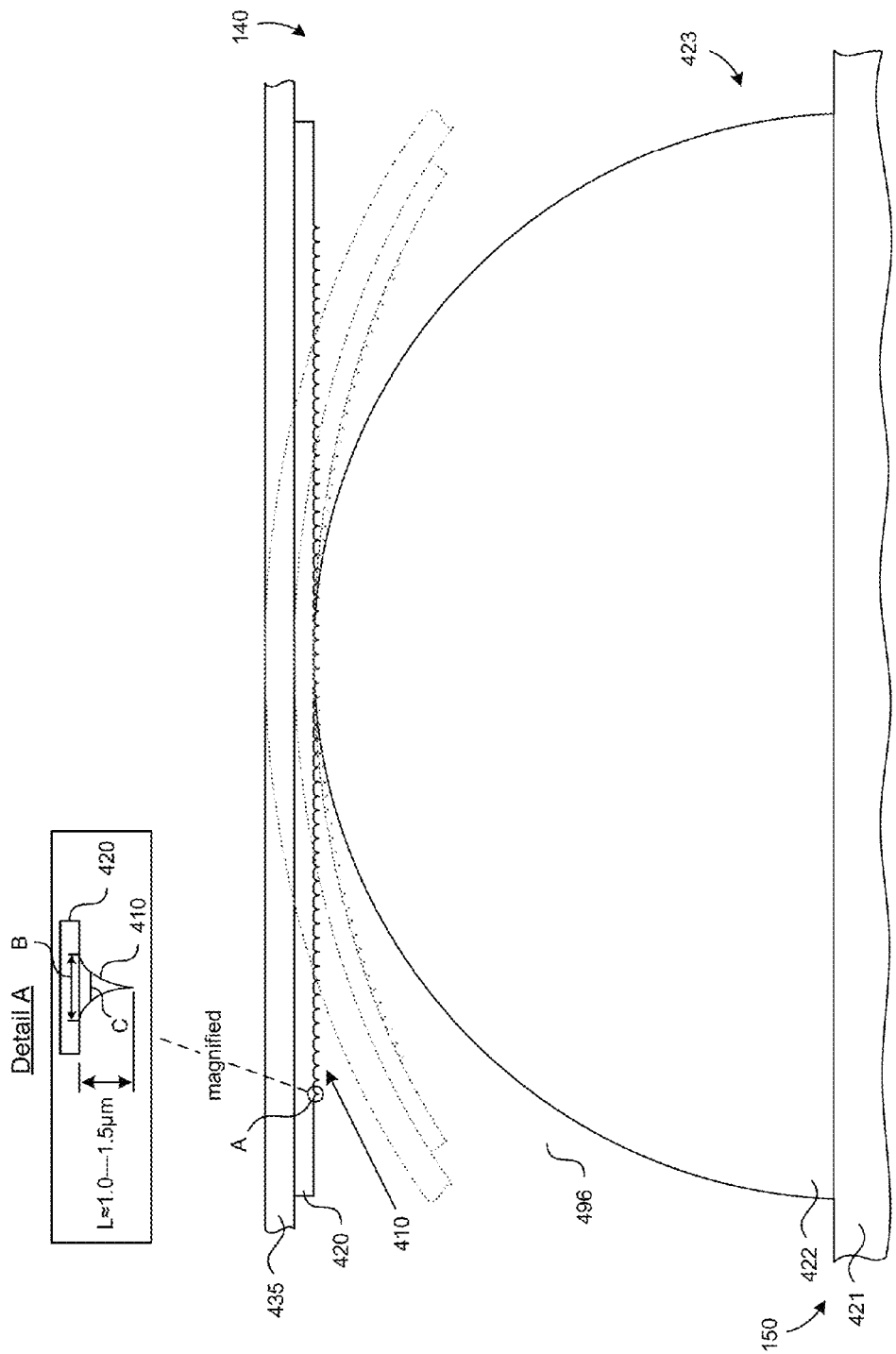
FIG. 5 is a partially schematic, side view of a nanospikes-based contactor in accordance with an embodiment of the presently disclosed technology.

FIG. 5 is an enlarged view of a portion of the translator 140 and the wafer 150, illustrating the contact between the nanospikes 410 of the translator 140 and the contact structure 423 (e.g., the solderball 422). The nanospikes 410 can be distributed over the wafer side nanospike pad 420 which is attached to the translator board 435. In some embodiments of the present technology, several nanospikes 410 contact the contact structure 423, and in other embodiments hundreds or more nanospikes may contact the contact structure. The nanospikes 410 can have a length (L) of about 1.0-1.5 µm and a base (B) of the same scale (e.g., about a µm scale), resulting in a nanospike cross-section (C) ranging from about several $\mu m^2$ at the base B to sub-$\mu m^2$ closer to the tip of the nanospike. In some embodiments of the present technology, the nanospikes are approximately 0.3-2 µm long and in other embodiments the nanospikes, have other suitable lengths. Since the nanospikes 410 are significantly smaller than the solderball 422, the contact does not mechanically damage the solderball. If a vacuum is used in the space 496 between the translator board 435 and the pad 422, the translator board 435 and the nanospike pads 420 may bend (as illustrated in dashed lines), thus further reducing the electrical contact resistance by bringing even more nanospikes 410 in contact with the solderball 422.

Figure 6:
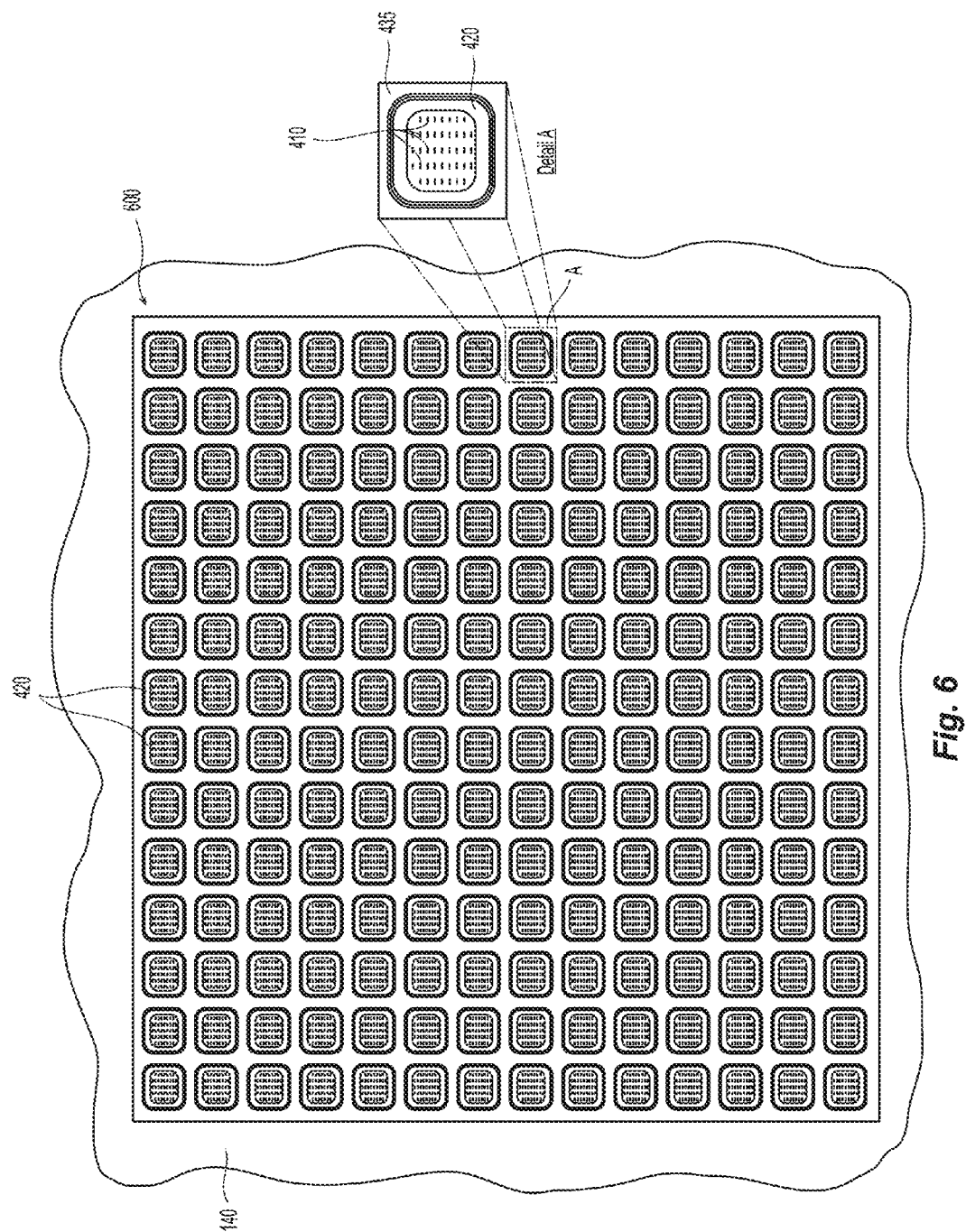
FIG. 6 is a bottom view of the nanospikes-based contactor in accordance with another embodiment of the presently disclosed technology.
Figure 7:
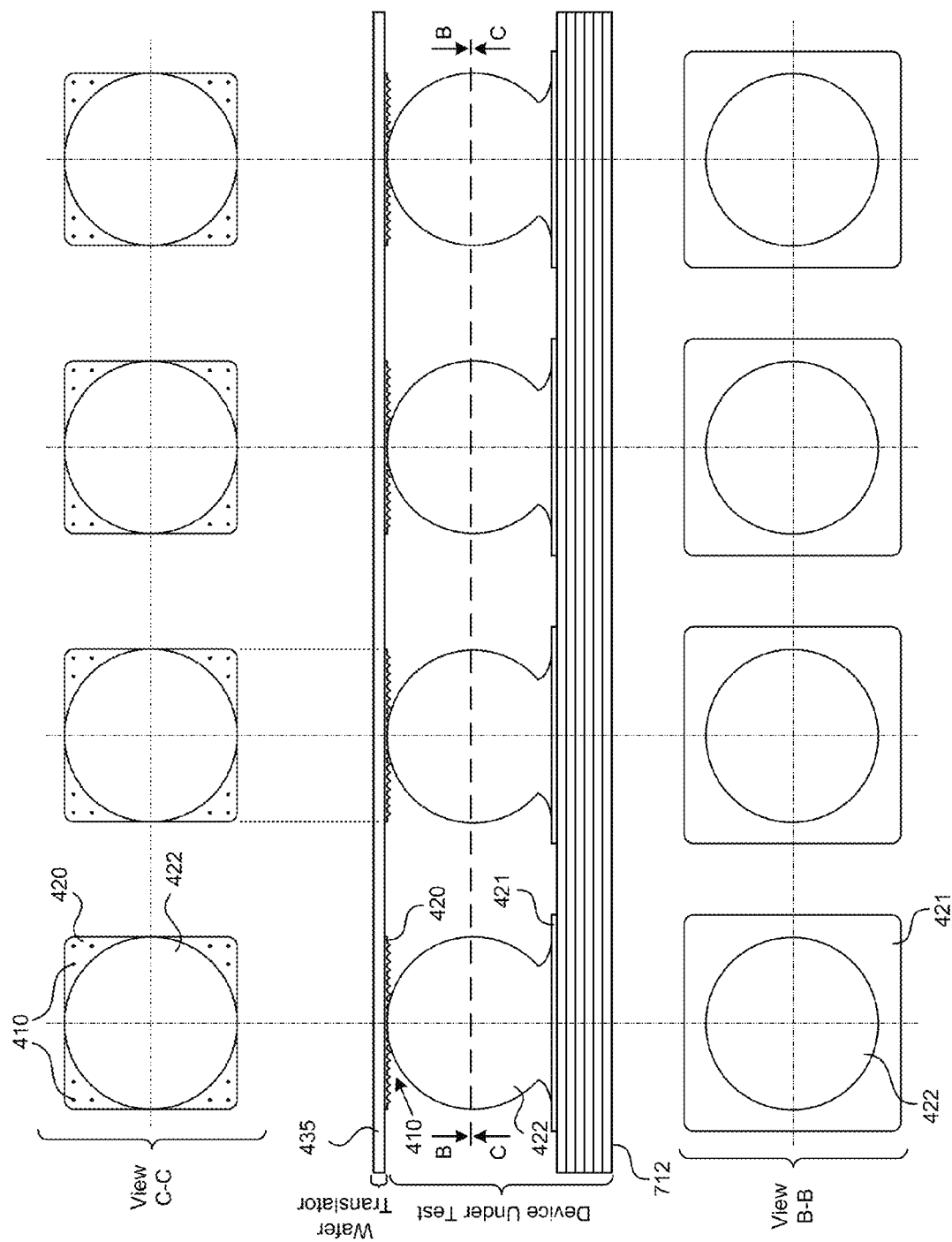
FIGS. 7A-7C include several partially schematic views illustrating the nanospikes-based contactor in accordance with the presently disclosed technology.

FIG. 6 is a bottom view of a wafer side contact pad array 600 of the wafer translator 140. The contact pad array 600 may include multiple nanospike pads 420 arranged to correspond to the die contacts of one or more dies on a wafer. For example, the pad array 600 can include a 14×14 array of nanospike pads 420 in the illustrated embodiment, or a variety of other suitable configurations in other embodiments. In some embodiments of the present technology, the nanospike pads 420 on the wafer side of the translator 140 may be formed even where there are no corresponding contact pads/solderballs on the die, for example to simplify the manufacturing process of the nanospikes. Detail A of FIG. 6 is an enlarged view of one nanospike pad 420. Detail A illustrates a generally rectangular layout of the nanospikes 410. In other embodiments, the nanospikes 410 can be distributed in concentric circles, in staggered rows, randomly, and/or in other arrangements. Many suitable layouts can produce good mechanical and electrical contact between a sufficient number of the nanospikes 410 on a nanospike pad 420 and a corresponding pad/solderball of the device under test because of the small size of the nanospikes in comparison with the larger pads/solderballs.

FIGS. 7A-7C are a side view, a top view cross-section and a bottom view cross-section, respectively, of a row of the solderballs 422 in contact with the corresponding nanospikes 410 described above. The solderballs 422 are electrically connected to a die 712 via the corresponding pads 421. In some other embodiments, for example, when the device under test is a packaged semiconductor device, the pads 421 may be connected to a substrate which carries the die. In either of these embodiments the nanospikes 410 can provide suitable electrical contact with the corresponding solderballs 422 even with some misalignment between the nanospike pads 420 and the solderballs 422. Because the multiple current-carrying nanospikes 410 are distributed over a suitable area, the nanospikes contact corresponding solderballs even if the nanospike pads 420 are not perfectly centered on the corresponding solderballs 422. Accordingly, the alignment requirements for the overall system can be relaxed, thus potentially reducing system complexity and/or cost. In some embodiments, the alignment between the translator and the device under test can be purposely offset from one touchdown to another so as to contact different regions of nanospikes with the corresponding device contact structures. An advantage of this arrangement is that it can, for example, more evenly wear the nanospikes or require less frequent cleaning of the nanospikes. In other embodiments, the device under test or/and the translator may move, at least in part, laterally (i.e., in generally parallel planes) after establishing a contact to further improve the contact between the nanospikes and corresponding contact structures of the device under test.

Figure 8:
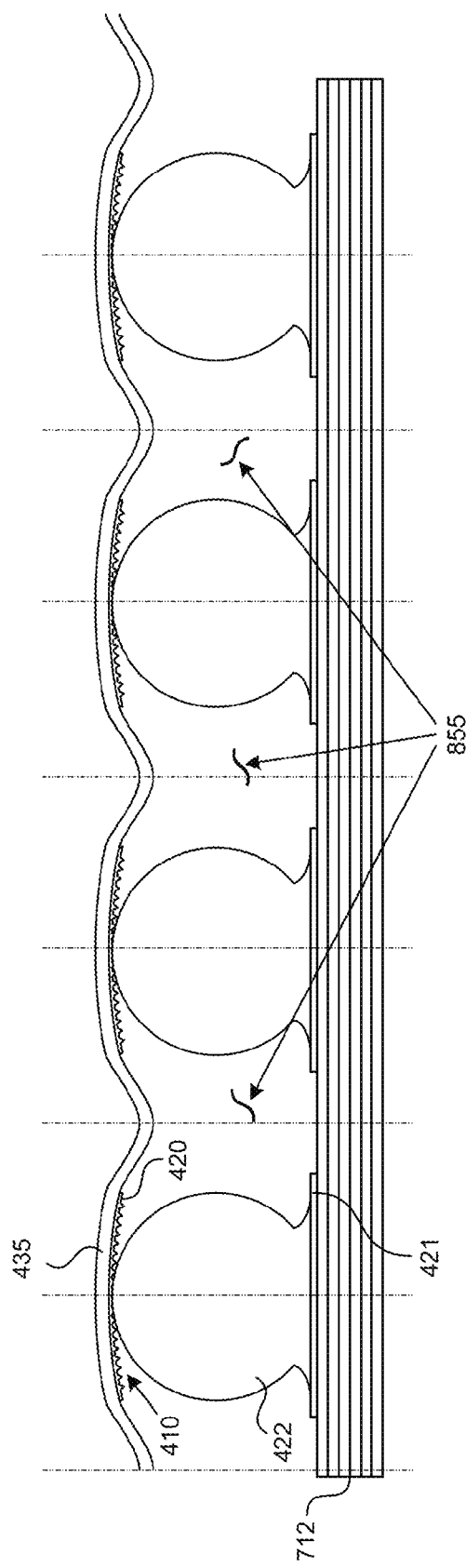
FIG. 8 is a side view of the nanospikes-based contactor when vacuum is applied in accordance with an embodiment of the presently disclosed technology.

FIG. 8 is a side view of the solderballs 422 in contact with the nanospikes 410. In this embodiment, a vacuum (represented by reference number 855) is applied to the space between the wafer translator and the wafer. The vacuum 855 can improve the contact between the nanospikes 410 and the solderballs 422. In some embodiments of the present technology, the vacuum 855 may also cause the wafer translator board 435 to flex (e.g., as described above with reference to FIG. 5), which can further improve the contact between the nanospikes 410 and the solderballs 422. For example, flexing the translator board 435 can drive more nanospikes 410 into the solderballs 422 than can a flat translator board because the flexed translator board conforms, at least in part, to the surface of the solderballs 422. The flexing of the wafer translator board illustrated in FIG. 8 is not necessarily drawn to scale, and may be smaller and/or distributed in other manners in some embodiments of the present technology.

Figure 9:
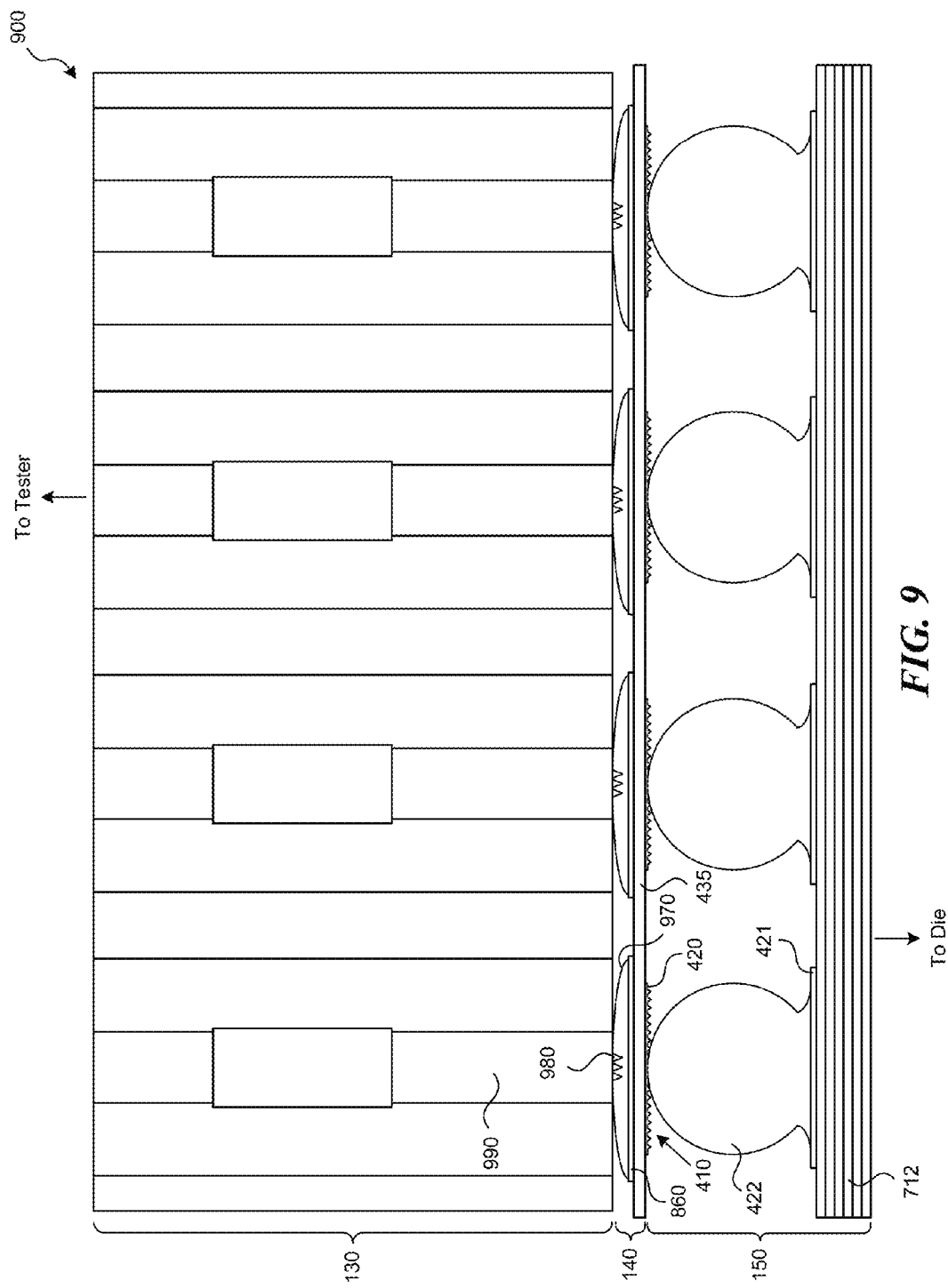
FIG. 9 is a side view of a nanospikes-based translator stack in accordance with the presently disclosed technology.

FIG. 9 is a side view of a test assembly 900 having a stack of (from bottom-to-top) the wafer 150, the translator 140 and the interposer board 130. The wafer 150 contains multiple dies 712, which can be contacted and tested one die at a time or simultaneously. The nanospikes 410 on the wafer side of the translator 140 are electrically routed through the translator board 435 to the inquiry side pads 960. In some embodiments, inquiry side solderballs 970 may be disposed on the inquiry side pads 960. Since the inquiry side solderballs 970 are relatively large (in comparison with the curved top surface of the die solderball 422), the interposer board 130 can include relatively large interposer pins 990. In some embodiments, the interposer pins 990 can have inquiry side penetrators 980 for breaking the oxide layer over the inquiry side solderballs 970. The opposite sides of the interposer pins 990 can be connected to the interposer board and further to the tester.

Figure 10A:
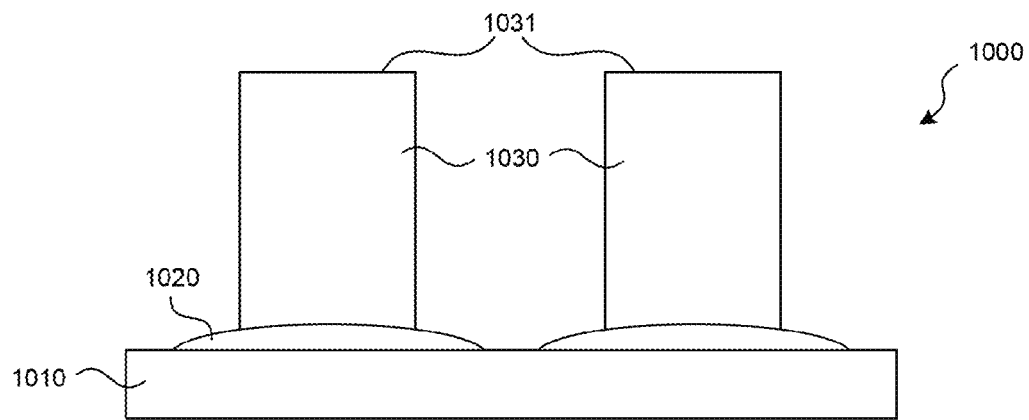

FIGS. 10A-10G illustrate a representative process for manufacturing the nanospikes in accordance with an embodiment of the present technology. FIG. 10A shows a nanospike manufacturing assembly 1000 having carriers 1030 attached to a manufacturing substrate 1010 by carrier attach elements 1020. The carriers 1030 can have a diameter (or, for a non-circular shape, another characteristic cross-sectional dimension) that is generally close to the size of the nanospike pad. The carriers 1030 can be made of metal or another electrically conductive material including, for example, heavily doped semiconductors or graphite. As explained in relation to FIGS. 10B-10G below, the nanospikes form on top sides 1031 of the carriers 1030.

Figure 10B:
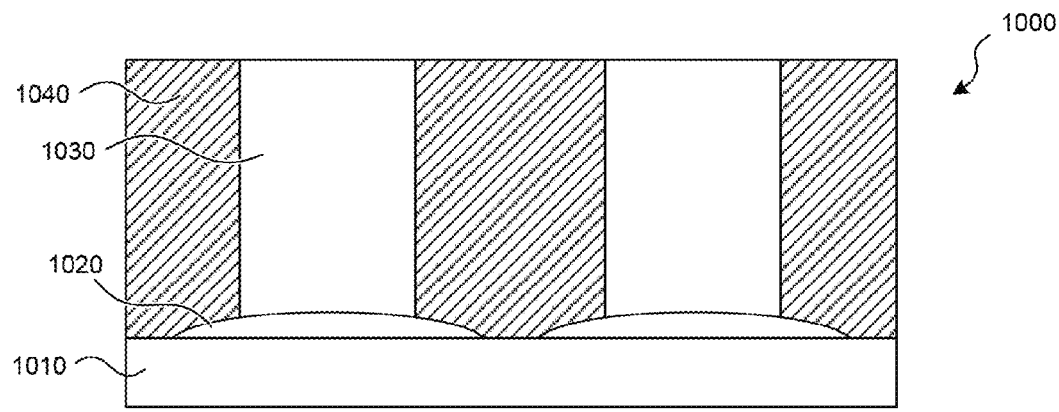

FIG. 10B shows the nanospike manufacturing assembly 1000 with the carriers 1030 in an encapsulation material 1040. The encapsulation material 1040 can include, for example, silicon epoxy, and/or other suitable constituents. The encapsulation material 1040 can maintain a fixed distance between the carriers 430 and can also protect the overall assembly from damage during the manufacturing process.

Figure 10C:
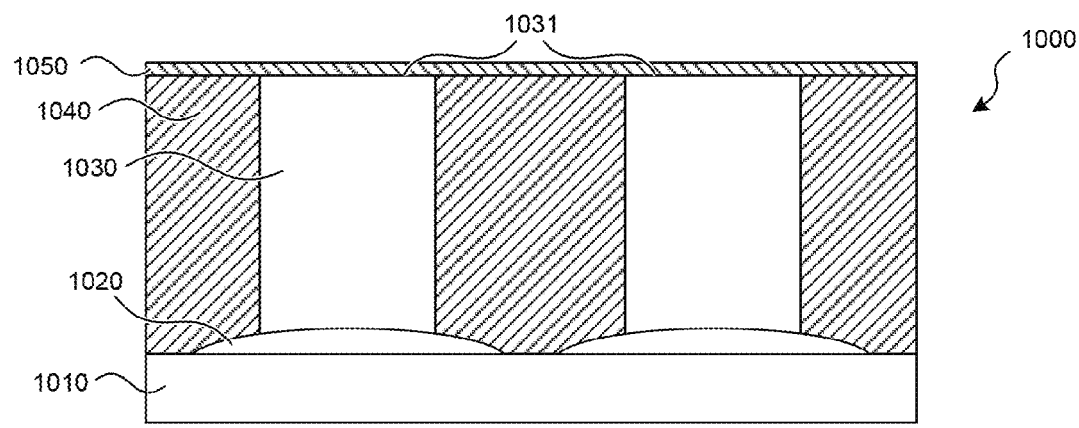
Figure 10D:
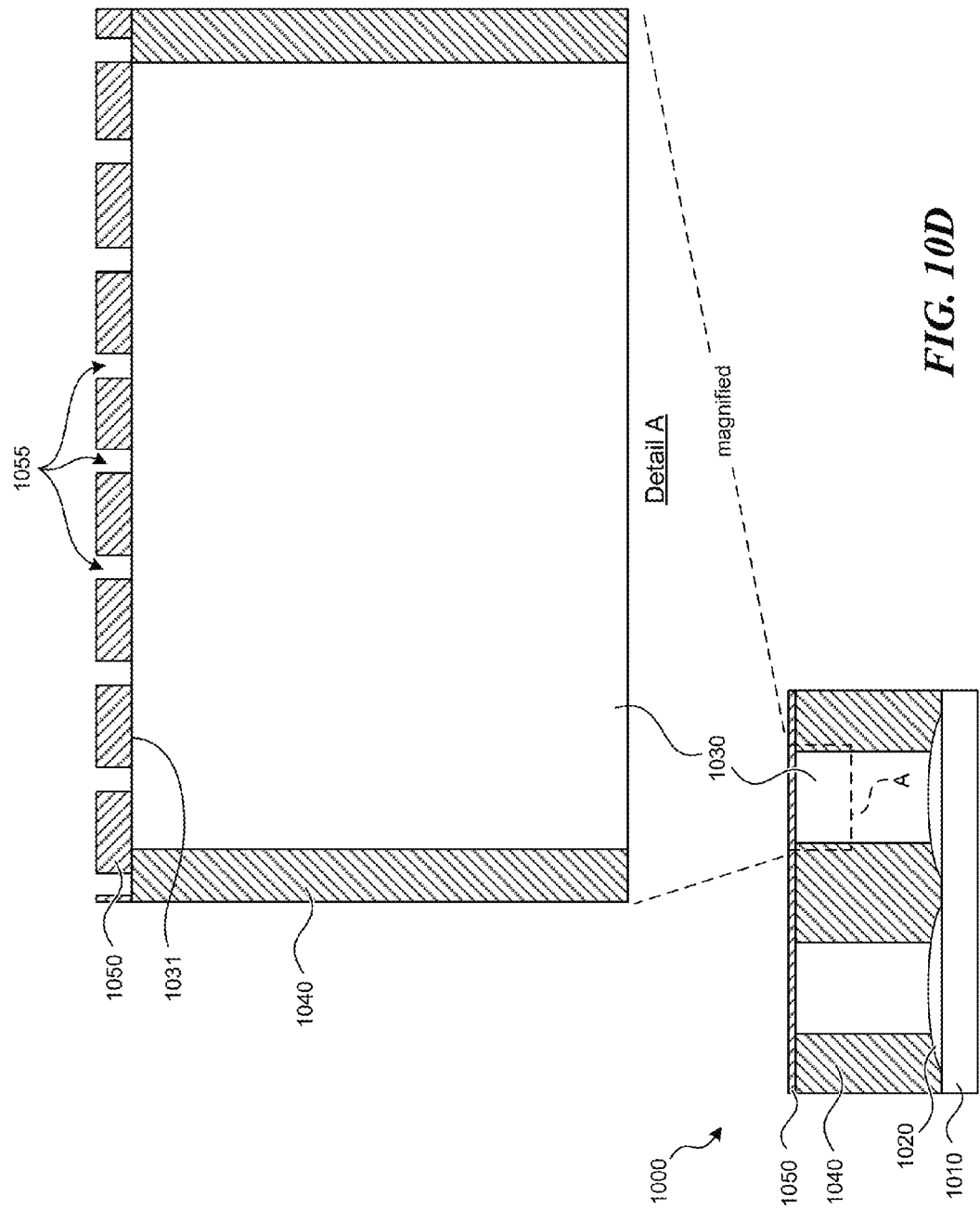

FIG. 10C illustrates the nanospike manufacturing assembly 1000 with a suitable photoresist material 1050 applied over the top sides 1031 of the carriers 1030. FIG. 10D (including Detail A) illustrates the nanospike manufacturing assembly 1000 after openings 1055 have been formed in the photoresist material 1050. The locations of the openings 1055 generally corresponds to the locations of the nanospikes which will be manufactured on the top sides 1031 of the carriers 1030. In at least some embodiments, the diameter of each opening 1055 approximates a desired diameter of a corresponding nanospike. Therefore, the nanospikes having similar dimensions, i.e., high regularity, can be manufactured when the openings 1055 have similar size. The thickness of the photoresist material 1050 can, at least in part, determine the length of the nanospikes.

Figure 10E:
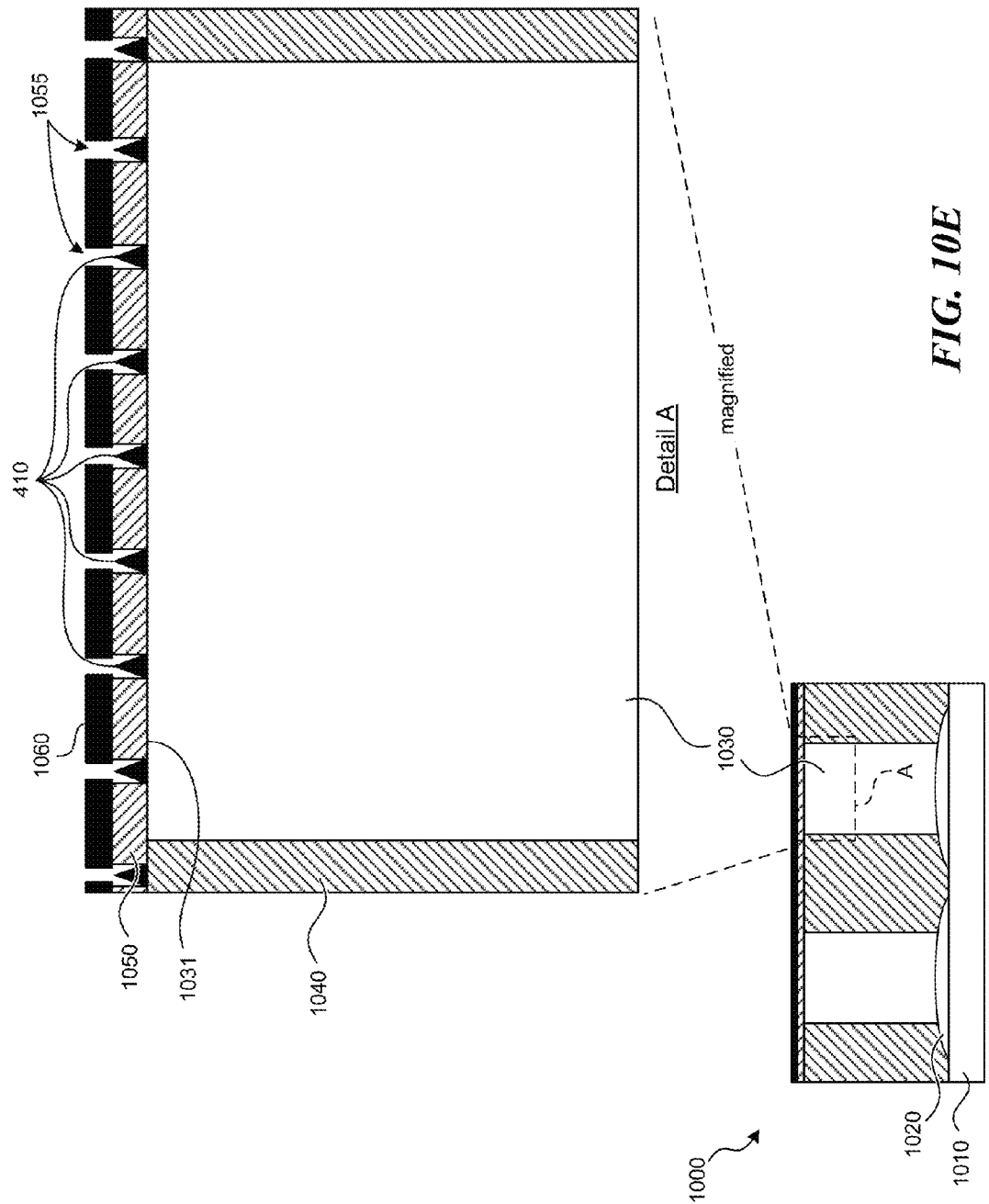

FIG. 10E (including Detail A) illustrates the nanospike manufacturing assembly 1000 after a nanospike material has been disposed on the photoresist material 1050 and in the openings 1055 in the photoresist material 1050, e.g., by chemical vapor deposition, sputtering, or other suitable methods. Accordingly, disposing the nanospike material creates both a layer 1060 over the photoresist material 1050, and the nanospikes 410 in the openings 1055 of the photoresist material 1050.

FIG. 10F (including Detail A) illustrates the nanospike manufacturing assembly 1000 after the photoresist material and the encapsulation material are removed. Suitable methods for removing the photoresist including, for example, applying a liquid resist-stripper, which chemically alters the resist so that it no longer adheres to the underlying carriers 1030. In some other embodiments, the photoresist material may be removed by a plasma containing oxygen (i.e., by "ashing"), which oxidizes and removes the photoresist material. After the photoresist material is removed from the carriers 1030, the nanospikes 410 are exposed.

Figure 10G:
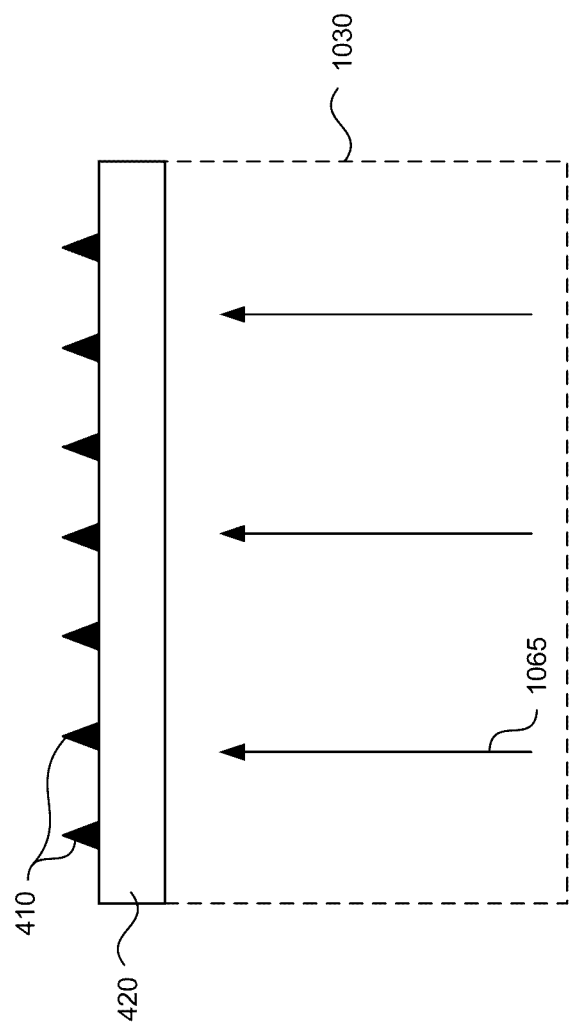

FIG. 10G illustrates a process for thinning the carriers 1030, which forms the nanospike pads 420 that support the nanospikes 410. The removal process is indicated schematically by arrows 1065. Suitable methods for thinning the carriers 1030 include, for example, chemical etching or mechanical grinding. The carriers 1030 may be singulated from the manufacturing substrate 410 (not shown) prior to thinning Suitable handlers (e.g., pick-and-place devices) can manipulate and/or hold in place the carriers 1030 during the thinning process. In at least some embodiments of the present technology, the manufacturing process described with reference to FIGS. 10A-10G can produce the nanospikes 410 attached to the nanospike pad 420 that is suitable for attachment to the translator.

Figure 11:
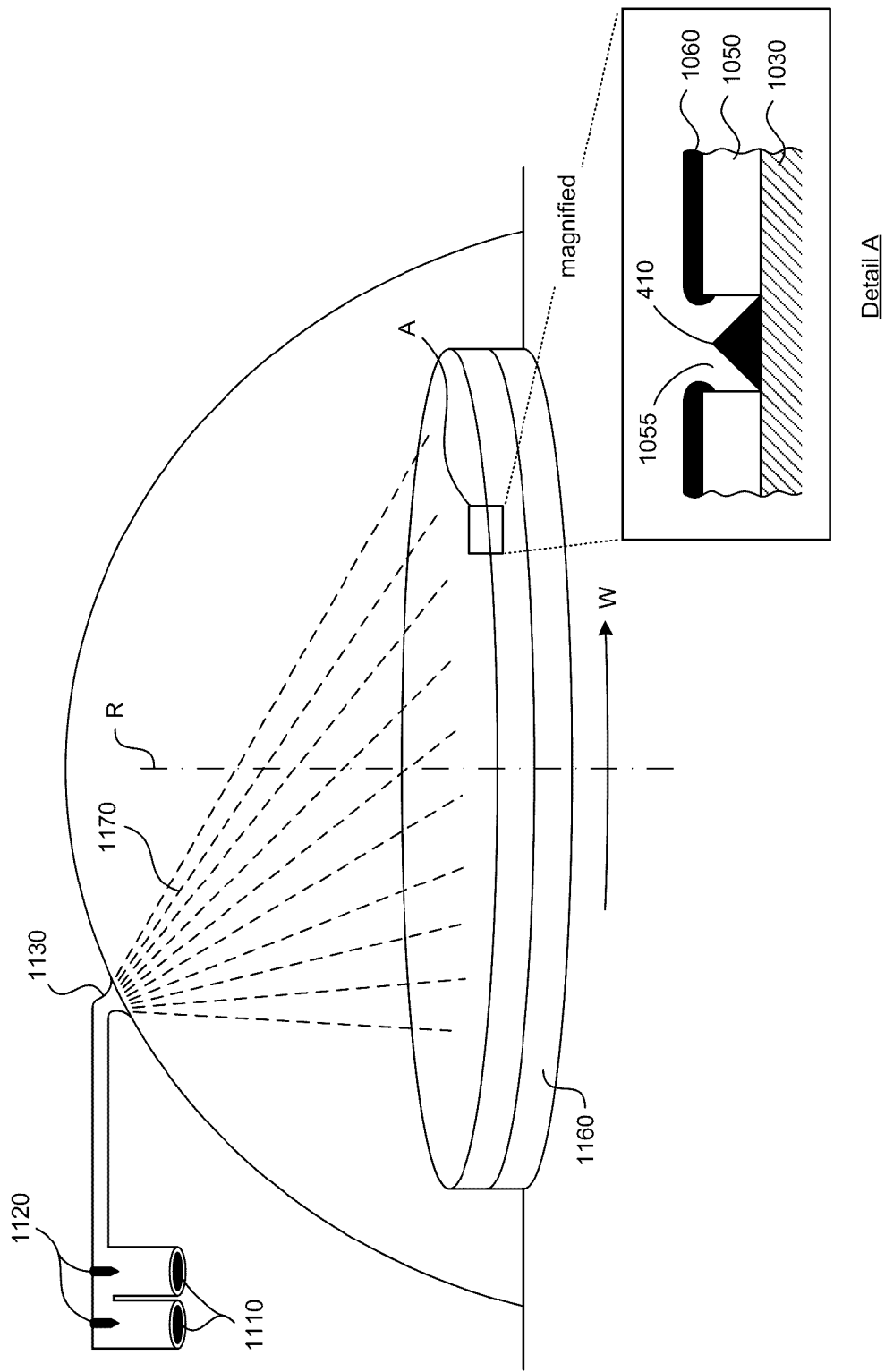
FIG. 11 is a schematic diagram of sputtering-based nanospike manufacturing process.

FIG. 11 (including Detail A) illustrates a sputtering process for manufacturing the nanospikes. In the illustrated embodiment, a sputtering material 1110 is fed past an electron source 1120 which can ionize the sputtering material. The ionized sputtering material 1170 is directed through a nozzle 1130 to a sputtering chamber 540 and further toward a sputtering chuck 1160 that supports the manufacturing substrate 1010, which in turn includes the carriers 1030. Detail A of FIG. 11 shows a carrier 1030 covered with a patterned photoresist material 1050. The sputtering material 1110 can accumulate in the openings 1055 of the photoresist material to form the nanospikes 410. The sputtering chuck 1160 can rotate about an axis R, thus exposing the openings 1055 to sputtering material arriving from different angles of incidence. The resulting build-up of the nanospikes 410 is discussed further below with reference to FIGS. 12A-13H.

FIGS. 12A-12D illustrate a sequence of steps for building up the nanospikes. Each of FIGS. 12A-12D illustrates a plan top view (the lower portion of the figure) and a cross-sectional side view (the upper portion of the figure) at a different angle of incidence relative to the ionized sputtering material 1170. Each figure corresponds to a 90° rotation of the sputtering chuck relative to the neighboring figure(s). At each rotation increment, different portions of the opening 1055 in the photoresist material 1050 are exposed to the incident of sputtering material 1170, as illustrated in cross-section in the upper portions of the figures. The illustrated rotations uniformly or generally uniformly expose the opening 1055 to the ionized sputtering material 1170, despite the non-zero incidence angle of the ionized sputtering material 1170. During the illustrated process, the accumulation of the ionized sputtering material 1170 in the opening 1055 causes the nanospike to grow, as shown by the progression of accumulated material 1210a-1210d. Ultimately, the process can produce a generally symmetric and conical nanospike 410.

FIGS. 13A-13H illustrate a sequence of steps for building up a nanospike in accordance with another embodiment of the nanospike manufacturing process. Representative cross-sections and corresponding plan views are shown one above the other for each step. In this embodiment the 90° rotation increments occur more frequently than in the embodiment shown in FIGS. 12A-12D. Therefore, the sputtering wafer spends less time at each position, resulting in smaller increments of the vertical build-up of the nanospike at a given position. As a result, in at least some embodiments, the nanospike 410 can be made in pyramid-like layers, for example layers 1310a-1310d. As the sputtering chuck spends ever shorter times at any given position, the rotation approximate a continuous rotation, producing a nanospike shaped as a cone with amore continuous outer surface.

Figure 14C:
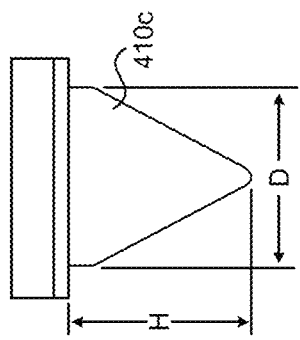
FIGS. 14A-14F illustrate several nanospike shapes in accordance with the present technology.
Figure 14B:
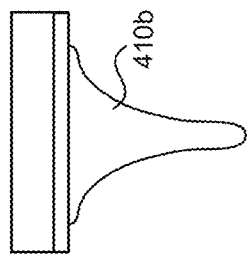
Figure 14F:
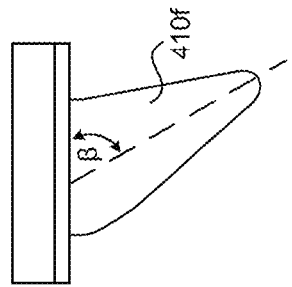
Figure 14E:
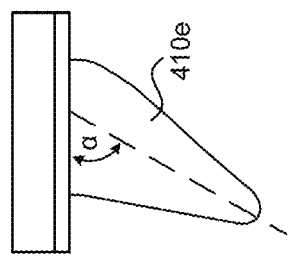
Figure 14A:
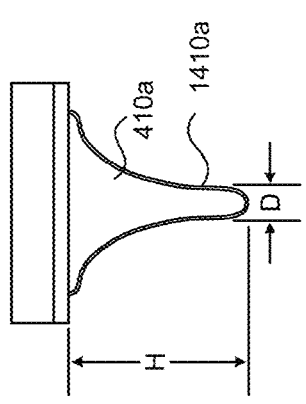
Figure 14D:
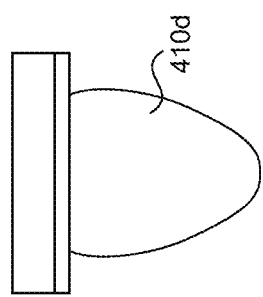

FIGS. 14A-14F illustrate several nanospikes in accordance with still further embodiments of the present technology. Combinations of the sputtering wafer rotation, the sputtering source strength and/or the sputtering source angle can produce nanospikes with different cross-sectional shapes. Some representative shapes are shown in FIGS. 14A-14F. For example, FIG. 14A illustrates a nanospike 410a having a concave cross-section with a tip diameter D and height H. In some embodiments the height H can be about 1-1.5 μm. The nanospike 410a can be covered by a cover material 1410a, which is an overlay layer generally thinner than the bulk material forming the nanospike 410a. The nanospike 410a and the cover material 1410a can include different materials. For example, the nanospike material can be good electrical conductor, e.g., aluminum or copper, while the cover material 1410a can be hard and/or abrasion resistant material, e.g., a carbide compound or titanium. In other embodiments, the cover material can resist or inhibit sticking to the solder or pad material, thus reducing the likelihood for contaminating the nanospike contactors. As will be described further below with reference to FIG. 18, hard materials may provide for suitable coatings, even if they are not optimally electrically conductive. FIG. 14B illustrates a nanospike 410b with a concave cross-section, similar to the nanospike 410a shown in FIG. 14A, but without the cover material 1410a. FIG. 14C illustrates a nanospike 410c with a generally triangular cross-sectional shape having a height H and a base width D. FIG. 14D illustrates a nanospike 410d with a convex cross-section. FIGS. 14E and 14F illustrate nanospikes 410e and 410f with angled tips, which may improve the contact when the wafer translator (or other contact structure that carries the nanospikes) moves sideways during the contact with the contactor structure of the device under the test. The particular nanospike shape used for a given device under test can be selected based, for example, on the type, shape, and/or location of the contact structures carried by the device.

Figure 15A:
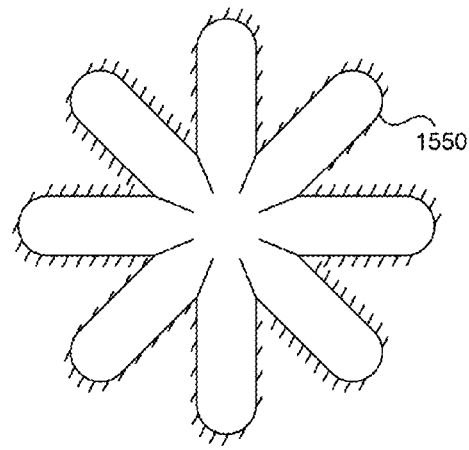
FIGS. 15A-15B illustrate a star-shaped nanospike in accordance with the present technology.
Figure 15B:
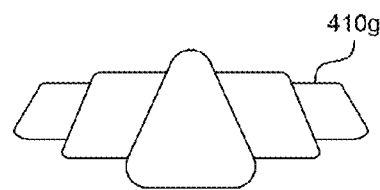
Figure 16A:
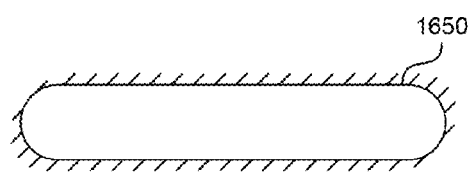
FIGS. 16A-16B illustrate a blade-shaped nanospike in accordance with the present technology.
Figure 16B:
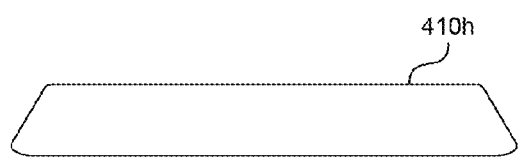
Figure 17A:
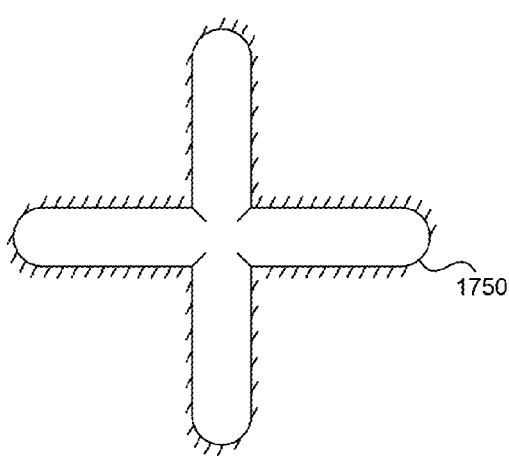
FIGS. 17A-17B illustrate a cross-shaped nanospike in accordance with the present technology.
Figure 17B:
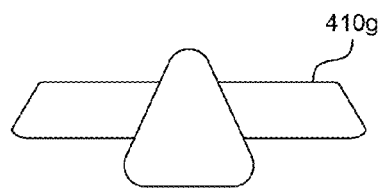

FIGS. 15A-17B illustrate the photoresist openings and the corresponding nanospike shapes in accordance with yet further embodiments of the present technology. FIG. 15A is a plan view of a star-shaped photoresist opening 1550, which, when used in conjunction with suitable sputtering chuck rotation increments, can produce a star-shaped nanospike 410g shown in FIG. 15B. Such a nanospike can be advantageous in some embodiments of the disclosed technology, for example to create a larger contact area between the nanospikes and the corresponding pads/solderballs. FIGS. 16A-16B illustrate a blade-shaped photoresist opening 1650 and the corresponding nanospike 410h. The blade-shaped nanospike 410h can be advantageous when, for example, a sliding of the nanospike over the pad/solderball is expected or desired. FIGS. 17A-17B illustrate a cross-shaped photoresist opening 1650 and the corresponding nanospike 410h. The cross-shaped nanospike 410h can be used when, for example, it is difficult to lithographically manufacture corners of the mask for the star-shaped nanospikes. In other embodiments, the photoresist opening and the corresponding nanospikes can have other suitable shapes to meet particular application requirements.

Figure 18A:
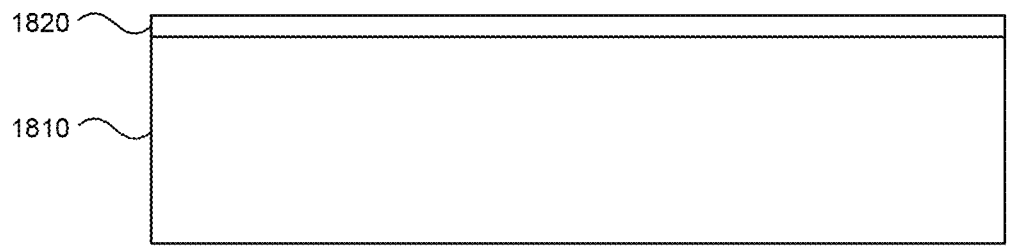
FIGS. 18A-18E are schematic diagrams of a nanospike manufacturing process in accordance with an embodiment of the presently disclosed technology.

FIGS. 18A-18E illustrate a representative process for molding the nanospikes in accordance with an embodiment of the present technology. FIG. 18A shows a nanospike manufacturing assembly 1800 having a molding substrate 1810 and a mask 1820. The molding substrate 1810 can be, for example, a silicon wafer having a <100> crystal orientation or other molding substrate material that is suitable for anisotropic etching.

Figure 18B:
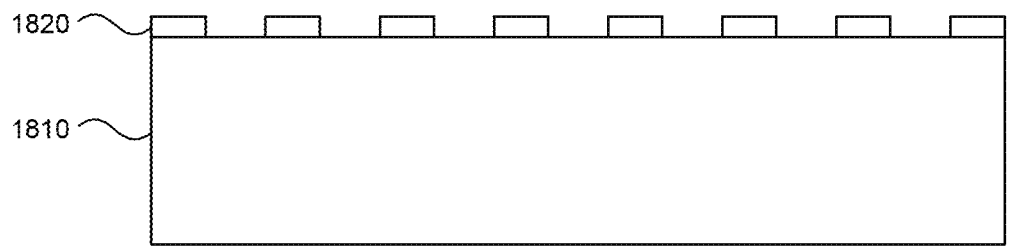

FIG. 18B shows the nanospike manufacturing assembly 1800 after a pattern of mask openings 1825 has been created in the mask 1820. The location of the openings 1825 generally corresponds to the location of the nanospikes which will be manufactured on or in the molding substrate 1810. In at least some embodiments, the diameter (or other characteristic dimension) of each opening 1825 approximates a desired diameter of a base of corresponding nanospike.

Figure 18C:
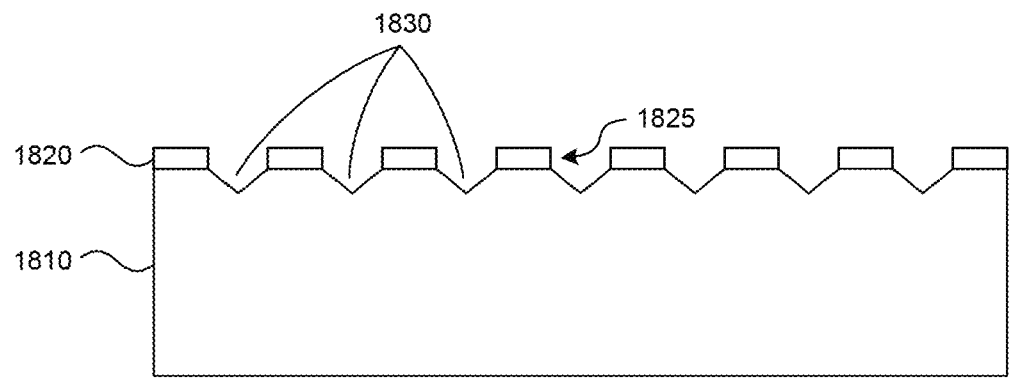

FIG. 18C shows the nanospike manufacturing assembly 1800 after a pattern of mold openings 1830 has been etched in the molding substrate 1810. In some embodiments, the molding substrate 1810 can be anisotropically etched using potassium hydroxide (KOH) or tetramethylammonium hydroxide (TMAH), and in other embodiments other anisotropic etchants are used. The shape of mold openings 1830 can be different depending at least in part on the shape of the openings 1825. For example, if the molding substrate 1810 is formed from the <100> silicon, a circular mask opening 1825 results in a generally conical mold opening 1830, while a rectangular mask opening 1825 results in a generally pyramidal mold opening 1830. Furthermore, combinations of different shapes of mask openings 1825 are used in other embodiments, resulting in corresponding combinations of shapes of the mold openings 1830.

Figure 18D:
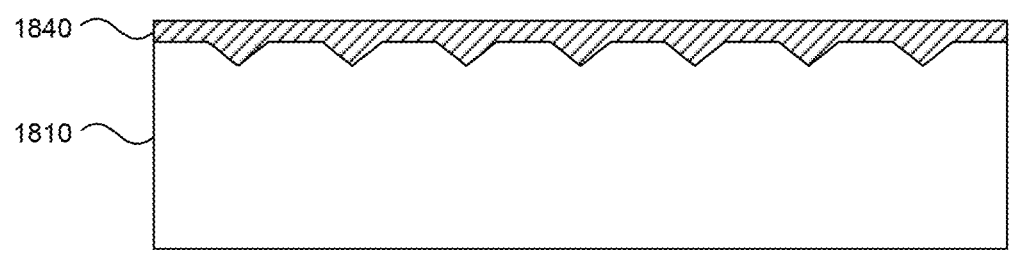

FIG. 18D shows the nanospike manufacturing assembly after the mask 1820 has been removed and a nanospike material 1840 has been applied over the molding substrate 1810. In some embodiments, the nanospike material 1840 can include several materials. For example, a seed conductive material can be applied first, followed by the remainder of the nanospike material 1840.

Figure 18E:
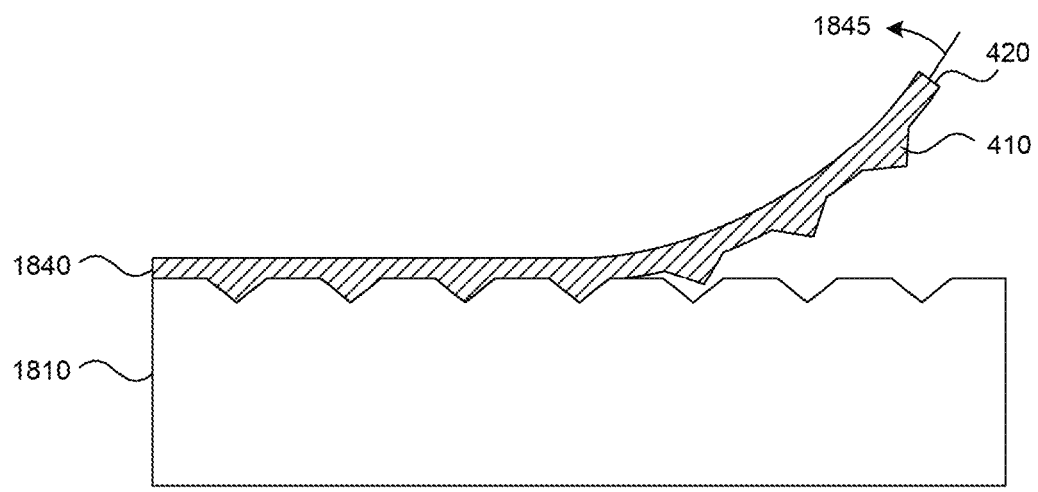

FIG. 18E shows a process for separating the nanospike material 1840 from the molding substrate 1810. In some embodiments, the nanospike material 1840 can be mechanically peeled from the molding substrate 1810 as generally indicated by an arrow 1845. The molding substrate 1810 can be reused to mold more nanospikes. In other embodiments, the molding substrate 1810 can be etched away leaving the nanospike material 1840 with the nanospikes 410 attached to the nanospike pad 420. After separation from the molding substrate 1810, the nanospike pad 420 carrying nanospikes 410 can be attached to a suitable board, for example the translator board 435 (FIG. 5) for contacting a device under test. Further representative manufacturing techniques are disclosed in co-pending U.S. application Ser. No. 13/842,830, titled "Designed Asperity Contactors, Including Nanospikes, for Semiconductor Test, and Associated Systems and Methods." Filed concurrently herewith and incorporated herein by reference.

Figure 19:
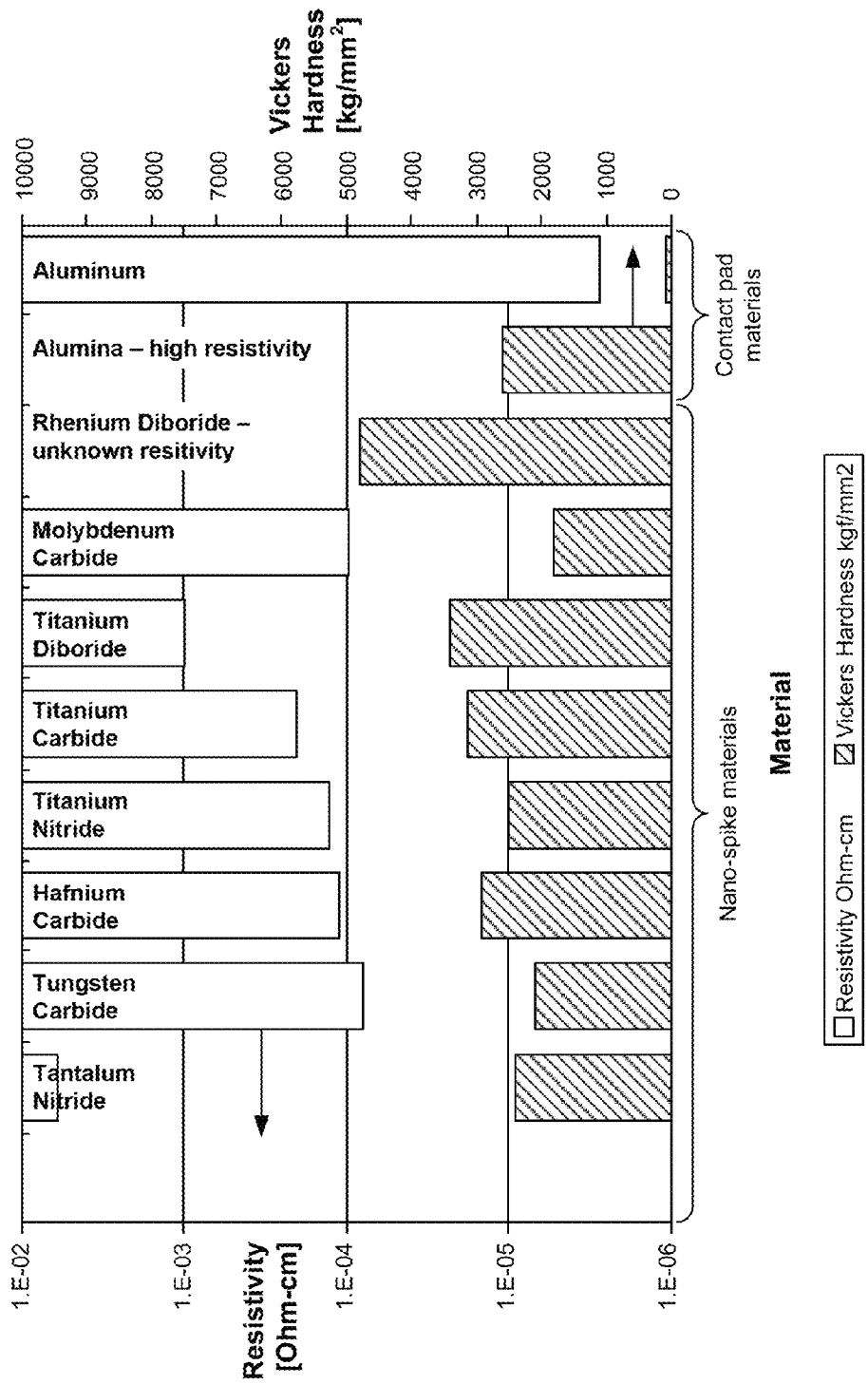
FIG. 19 is a graph of electrical resistivity and hardness of representative contact pad and nanospike materials.

FIG. 19 is a graph of electrical resistivity and Vickers hardness for several materials, e.g., materials suitable for nanospikes (the materials toward the left side of the graph) and materials suitable for representative contact pads (the materials toward the right side of the graph). The nanospike materials are generally selected to be harder than the contact pad materials to assure penetration of the pad materials (e.g., aluminum illustrated in the graph), and/or copper and tin based solders, which are softer than aluminum. In many applications, a layer of alumina (i.e., aluminum oxide) is the hardest material that can be expected on the contact pad. The nanospike material is also generally selected to be harder than the mating contact pad/solderball material on the device under test to increase the durability of the nanospikes. Since many nanospikes make contact with the corresponding pad/solderball, thus resulting in a relatively high cumulative contact area, the electrical conductivity of the nanospike material can be relatively low, yet can still produce acceptably high electrical conductivity of the nanospike based contactor. Therefore, in at least some embodiments, the nanospikes with relatively high electrical resistivity can perform well for as long as they are sufficiently hard. For example, tungsten carbide or hafnium carbide can be suitable nanospike materials based on their high hardness even though the electrical resistivity of these materials is higher than the electrical resistivity of commonly used electrical conductors like, for example, aluminum or copper.

The following sections describe the applications of the nanospikes (and/or other designed asperities) in testing the dies using a package having the nanospikes as part of a translator. As described below, the testing can be combined with packaging the good dies to create a fully tested packaged device (sometimes referred to as a "known good die" in the semiconductor industry).

Figure 20A:
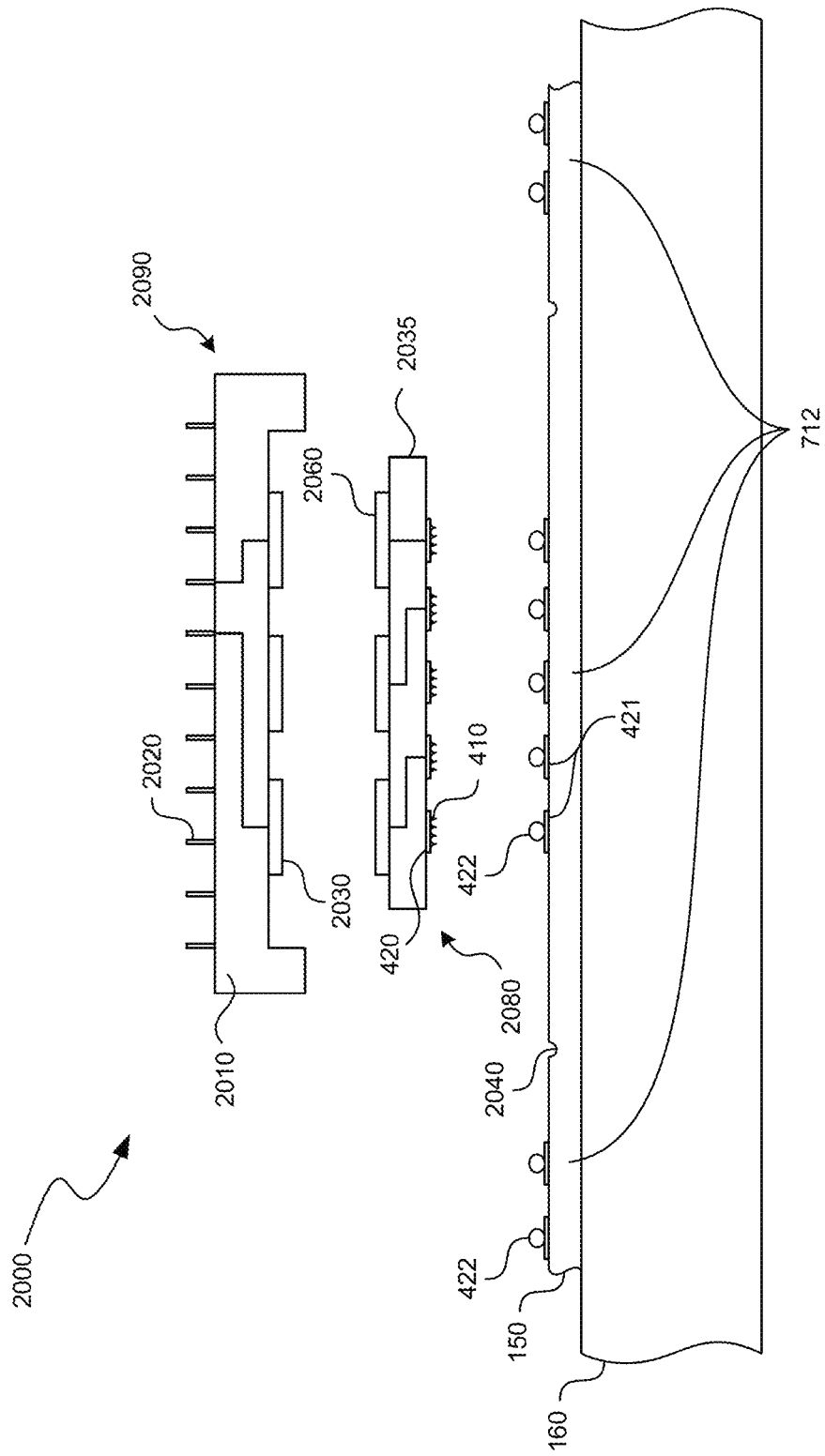
FIGS. 20A-20C are partially schematic diagrams of a bare die test using a package having nanospikes in accordance with an embodiment of the presently disclosed technology.
Figure 20B:
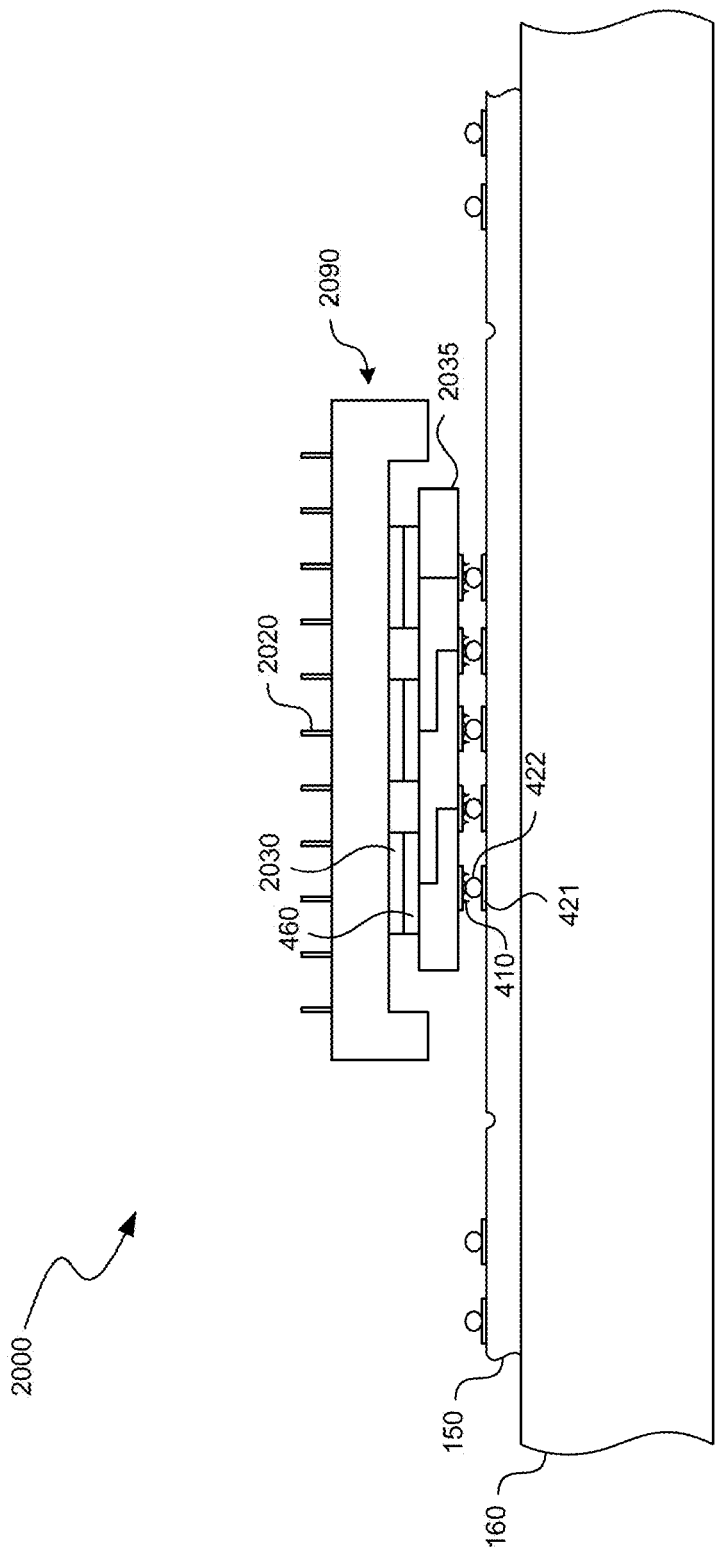
Figure 20C:
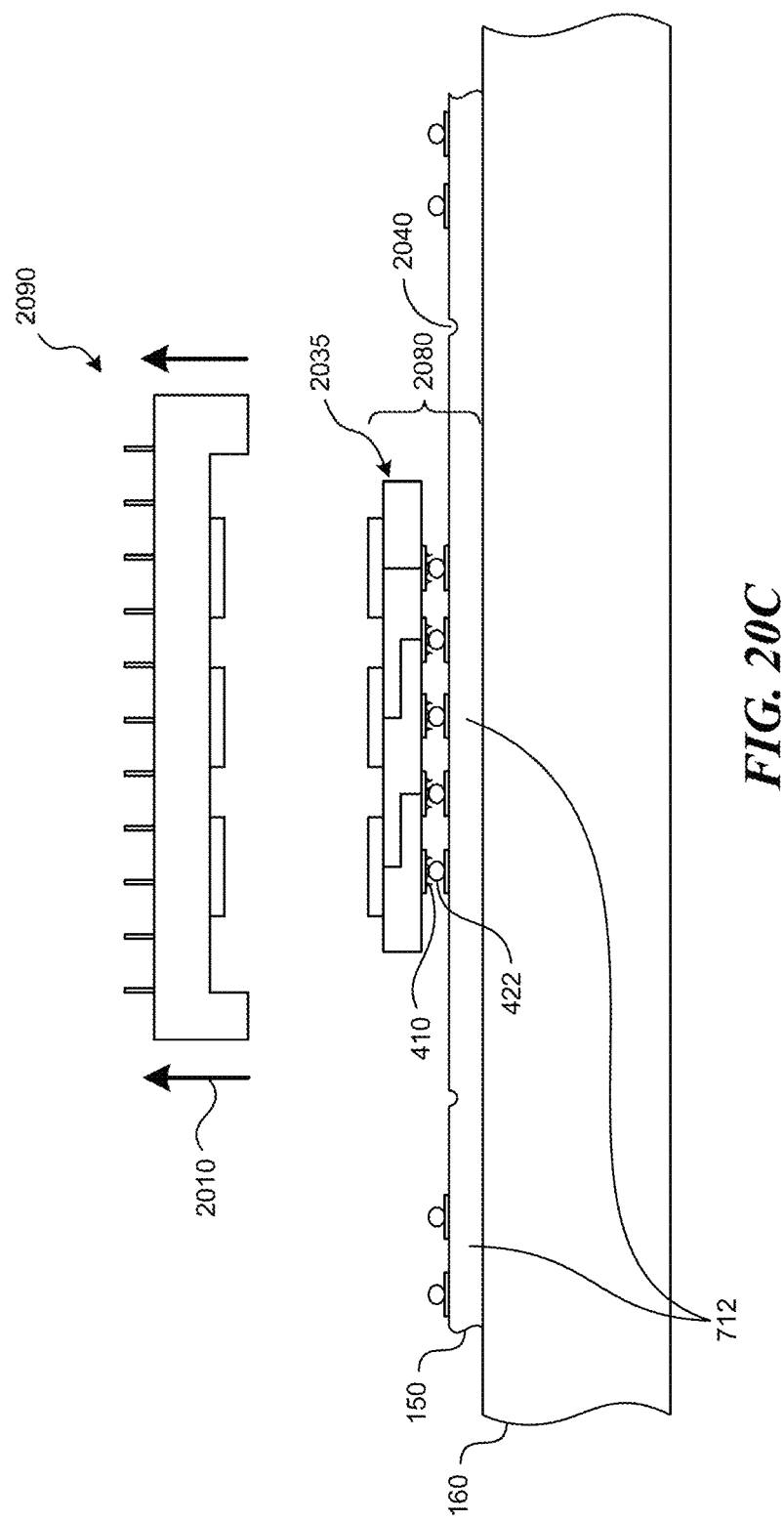

FIGS. 20A-20C schematically illustrate a package-based translator 2000 for testing a device while on the wafer. Many features of FIGS. 20A-20C are not shown to scale for purposes of illustration. As illustrated in an exploded view of FIG. 20A, the wafer 150 can be supported by a wafer chuck 160. The wafer 150 typically includes multiple dies 712 that are separated by wafer streets 2040. In a conventional process, after testing the dies 712, the wafer can be singulated using, for example, a wafer saw or other wafer singulation tools. Those dies 712 that passed the testing are packaged, re-tested and submitted to additional processing steps (e.g., burn-in, marking, etc.). However, with the embodiments of the present technology illustrated in FIGS. 20A-20C, the dies 712 can be tested using a package 2035 that is also a translator. The wafer side of the package 2035 can have nanospikes 410 attached to the nanospike pads 420. The layout of the nanospike pads 420 corresponds to the layout of the solderballs 422 on the die 712. The small size of the nanospikes coupled with generally large number of the nanospikes per each nanospike pad 420 provides easier alignment between the wafer side of the package 2035 and the die 712. The package 2035 includes traces connecting the nanospike pads 420 on the wafer side of the package to the larger inquiry pads 2060 on the opposite side of the package. The package 2035 can mate with a socket 2090 that is connected to a source of signals and power. In some embodiments, the package 2035 can be a socket that is normally used on a motherboard or other printed wireboard in conjunction with the packaged die. The socket 2090 can have package pads 2030 which in operation contact the corresponding inquiry pads 2060 on the package 2035. The package pads 2030 are connected to pins 2020 and further to appropriate power/signal channels of the tester (not shown) for testing the die 712.

FIG. 20B illustrates the package-based translator 2000 in operation. The socket 2090 and the package 2035 can be held together during the test and/or while stepping from one die 712 to another, e.g., via a vacuum handler, a pick and place device and/or other suitable device or technique. During the test, the nanospikes 410 contact the corresponding solderballs 422 to transfer signals and power from the tester (not shown) through the pins 2020. Since a combination of the socket 2090 and the package 2035 having the nanospikes can deliver the amount of current and the speed of signals to the die 712 that are comparable to what a packaged device would experience, the test parameters can be selected or tuned to at least approximate the test corresponding to that of the packaged device. Typically, the higher power and higher frequency that is representative of a packaged device test helps in detecting device defects that may have escaped the lower power/speed test done with conventional wafer contactors, thus reducing or eliminating the need for an additional test on the subsequent packaged device. If the tester determines that a particular die 712 failed the test, then the socket 2090 and the package 2035 can be moved to the next die 712 for testing. In some embodiments of the present technology, if the die 712 passes the test then the die can be packaged as explained with reference to FIG. 20C below.

FIG. 20C illustrates a packaged device 2080 having the solderballs 422 of the die 712 and the nanospikes 410 of the package 2035 soldered. In some embodiments of the present technology, when the die 712 passes the test, the die/package pair can be heated to cause an intermetallic bond between the solderballs 422 and the corresponding nanospike/nanospike pads of the package 2035. The socket 2090 can be removed and paired with a new package 2035 to test another die 712. The packaged devices 2080 can be singulated using, for example, a wafer saw. In at least some embodiments, the packaged device 2080 do not require additional testing because the device was already tested at suitably high speed/power conditions, as explained above. In some embodiments of the technology, different types of packages can be used to package devices of different performance (i.e., belonging to different "bins").

Figure 21A:
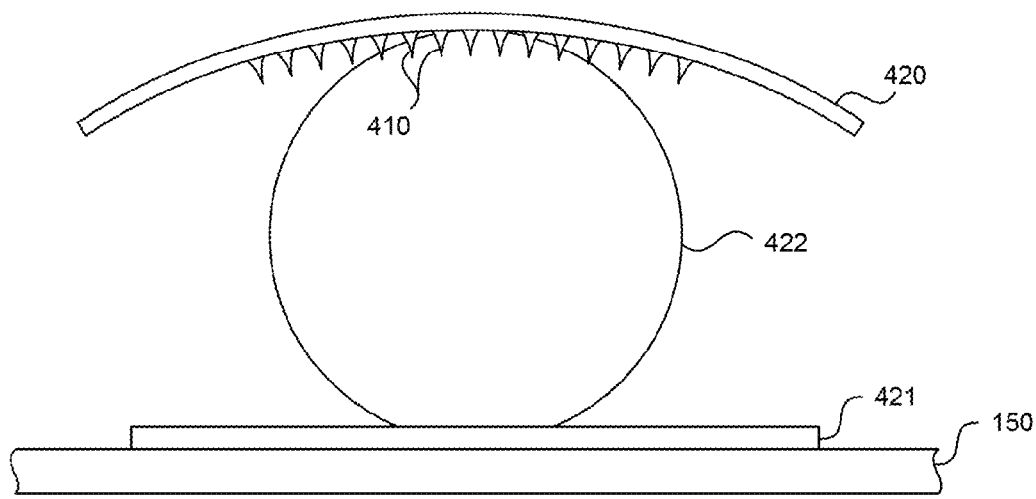
FIGS. 21A-21B are partially schematic diagrams of a nanospike/solderball attachment in accordance with an embodiment of the presently disclosed technology.
Figure 21B:
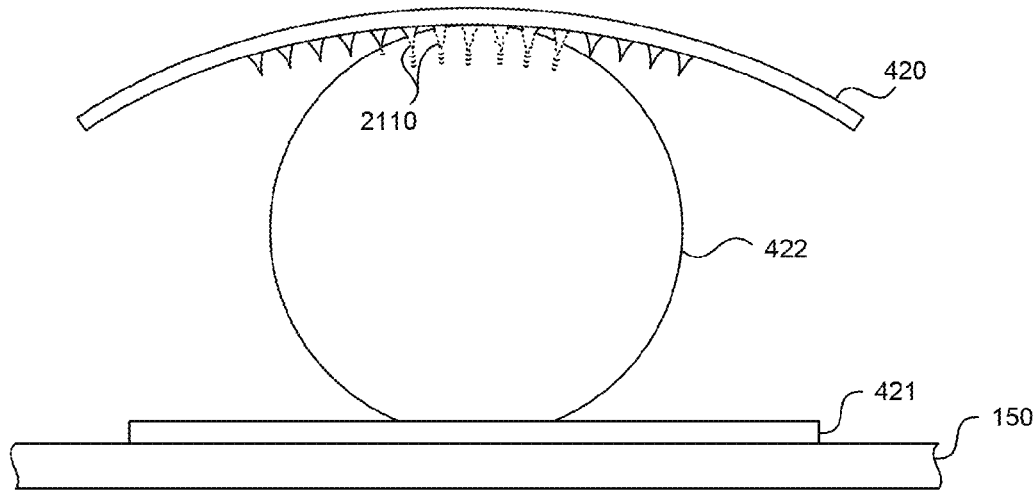

FIGS. 21A-21B schematically illustrate an intermetallic bond between the solderball 422 and the nanospikes 410. FIG. 21A schematically illustrates the nanospikes 410 in the solderball 422 after melting and resolidifying of the solderball 422. Heat for the melting can be provided by, for example, convective or radiative heating or increased electrical current between the nanospikes 410 and the solderballs 2035. An inert gas atmosphere (e.g., an atmosphere having $N_2$, Ar, or He) can be maintained during the melting process to improve the quality of the intermetallic bond. In at least some embodiments of the technology, the presence of many nanospikes 410 inside the solderball 422 improves the mechanical strength of the contact and reduces its electrical resistance. By bending or otherwise conforming the nanospike pads 420 (not necessarily drawn in scale), the operator can bring more nanospikes 411 in contact with the solderball 422 and can also accommodate for some inaccuracies in the solderball height and/or position.

FIG. 21B schematically illustrates an embodiment of a process for connecting the solderball 422 and the nanospikes 410 where the intermetallic bond includes at least partial melting of the nanospikes 410 into the solderball 422. In the illustrated embodiment, the solderball 422 may locally melt around the nanospikes 410 to promote diffusion of the nanospike material 2210 into the solderball. Resolidification of the nanospike material 2210 and/or the solderball 422 creates an intermetallic bond of high mechanical strength and low electrical resistance. In some embodiments, the nanospike material 2110 in the solderball 422 remains detectable, e.g., by crystallography and/or other methods.

Figure 22A:
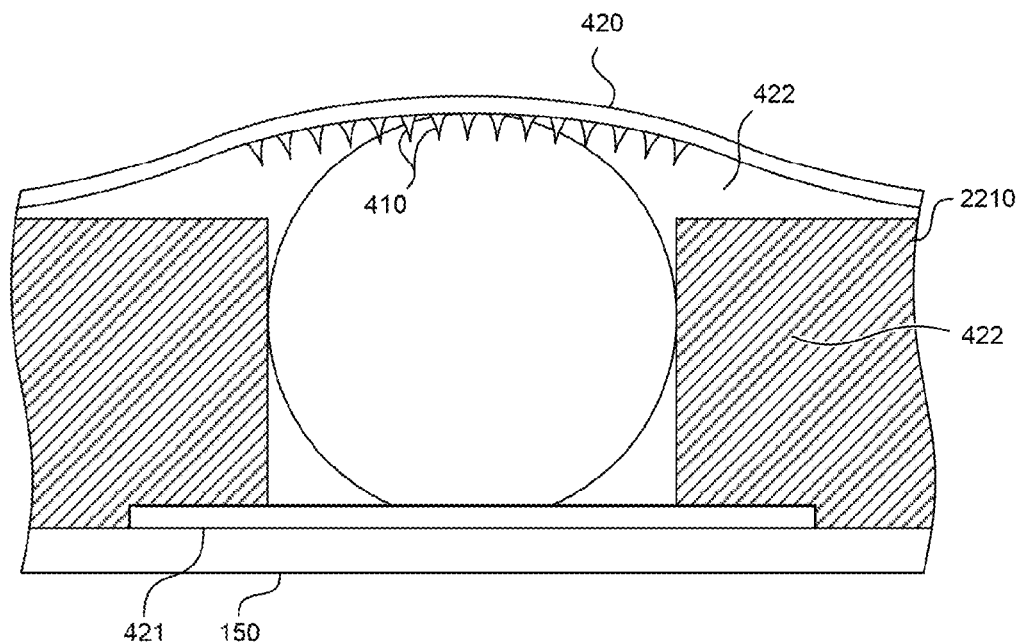
FIGS. 22A-22B are cross-sectional views of the nanospikes capable of an exothermic reaction in accordance with the present technology.
Figure 22B:
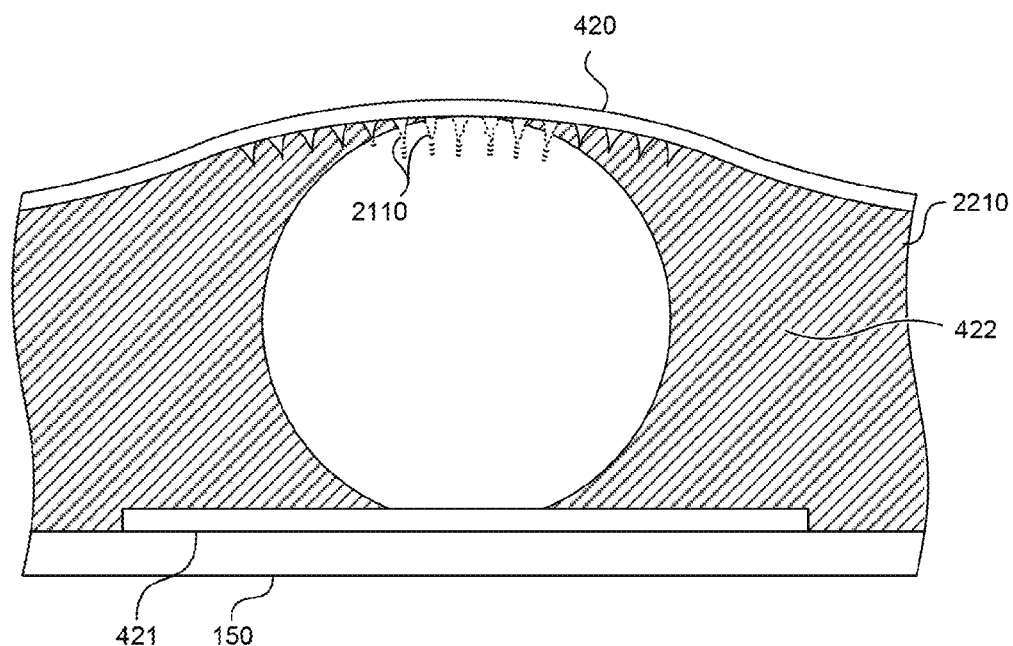

FIGS. 22A-22B schematically illustrate use of an underfill 2210 in conjunction with the intermetallic bond described with reference to FIGS. 21A-21B. Suitable underfill materials include electrically-insulating adhesives in a solid or liquid form, among others. FIG. 22A illustrates the underfill 2210 in the form of a solid sheet, with openings sized to correspond to the diameter of solderballs 422. FIG. 22B illustrates the underfill 2210 after the nanospikes 410 and the solderball 422 have been joined. In some embodiments of the present technology, the heat for melting the solderballs and/or the nanospikes can also melt the underfill 2210. In other embodiments, the underfill 2210 can be activated and melted separately from the process of creating the intermetallic bond between the nanospikes and the solderball. The surface tension of the melted underfill 2210 can promote distribution of the underfill 2210 around the solderball 422 and in contact with the nanospike pad 420 and pad 421 of the electronic circuit, thus reducing or eliminating thermally induced delamination or cracking of the interconnects.

Figure 23A:
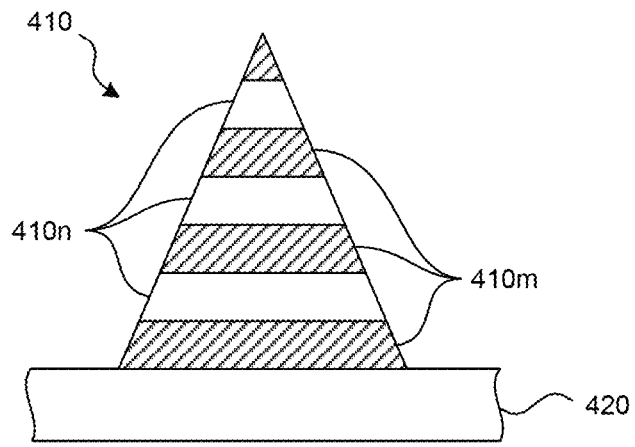
FIGS. 23A-23B are partially schematic diagrams of an underfill application in accordance with an embodiment of the presently disclosed technology.
Figure 23B:
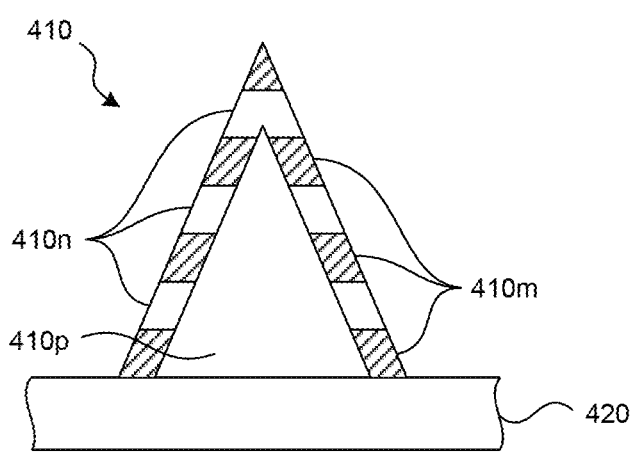

FIGS. 23A and 23B illustrate nanospikes 410 in accordance with further embodiments of the present technology. FIG. 23A illustrates a nanospike 410 having nanospike layers 410n and 410m. In some embodiments, the nanospike layers 410n can be nickel and the nanospike layers 410m can be aluminum. The nanospikes 410 can be made using manufacturing processes described in conjunction with FIGS. 10A-11. When ready to create an intermetallic bond, for example after a die tested "good" and is ready for packaging, an exothermic reaction can be started in the layers of the nanospike. The exothermic reaction can be started by, for example, inductive, acoustic or electrical heating, or by a laser. The exothermic reaction can be designed to melt the nanospike and a portion of the solderball to create intermetallic bonds. FIG. 23B illustrates (in cross-section) a nanospike 410 having the nanospike layers 410n, 410m disposed around a nanospike core 410p. The nanospike layers 410, 410m can be selected to undergo an exothermic chemical reaction after initiation, as explained with reference to FIG. 23A above. In some embodiments, the nanospike core can be copper that does not melt as the intermetallic bond forms.

Figure 24A:
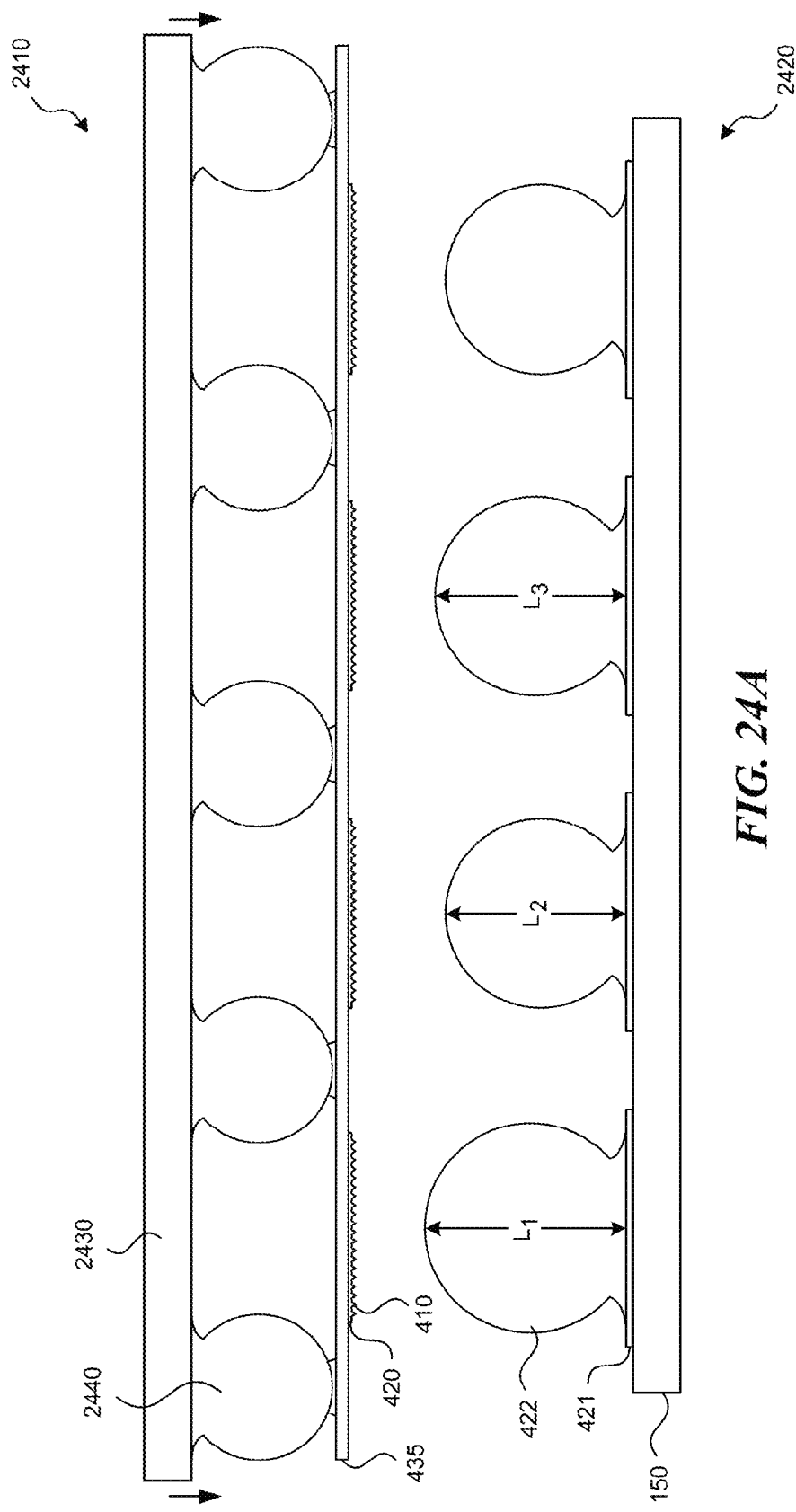
FIGS. 24A-24B are side views of a process for testing a device with uneven solderball heights using a nanospike-based contactor in accordance with the present technology.
Figure 24B:
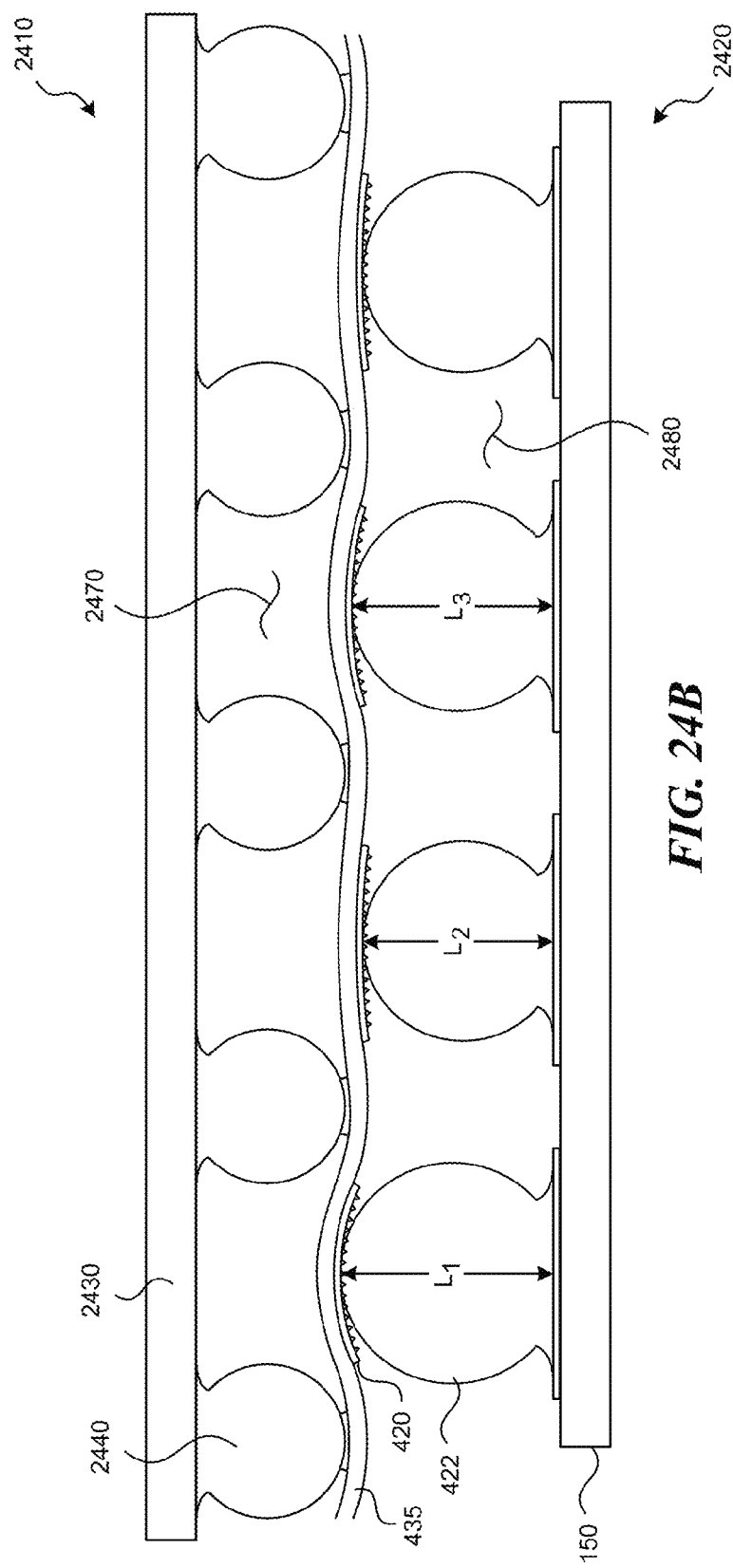

FIGS. 24A-24B illustrate a nanospike-based contactor 2410 in accordance with an embodiment of the present technology. The contactor 2410 can include nanospike pads 420 with the nanospikes 410. The nanospike pads can be attached to a translator board 435, which may be a flexible substrate, for example, a polyamide film or other stretchable substrate. Electrical traces (not shown) in the translator board 435 electrically connect the nanospike pads 420 to their respective solderballs 2440 and a contactor substrate 2430. In some embodiments, conductive columns, for example copper columns, can be used instead or in addition to the solderballs 2440. The signals and power from a tester (not shown) can be routed through the contactor 2410 stack to the nanospikes 410, and further to a die 2420. In some instances, the solderballs 422 on the die 2420 can have nonuniform height, as illustrated with the heights $L_1$, $L_2$ and $L_3$.

FIG. 24B illustrates the nanospike-based contactor 2410 in contact with the solderballs 422 of the die 2420. In the illustrated embodiment of the present technology, the translator board 435 can stretch to conform to the nonuniform height of the solderballs 422 (e.g., the heights $L_1$, $L_2$ and $L_3$). As a result, even a shorter solderball 422 (e.g., the solderball having the height $L_2$) can maintain good contact with the nanospikes 410. In some embodiments, the contact between the solderballs 422 and the nanospikes 410 can be improved by providing a pressure differential across the translator board 435, for example a lower pressure 2480 on the wafer side of the translator board 435 and a higher pressure 2470 on its opposite side.

The following sections describe the applications of the nanospikes for making the size and shape of the solderballs more uniform. In some applications, better uniformity of the size/shape of the solderballs can increase the test and packaging yields. This approach can accordingly address the problems associated with small non-uniformities and/or non-roundness of the solderballs causing a decrease in the testing/packaging yields.

Figure 25:
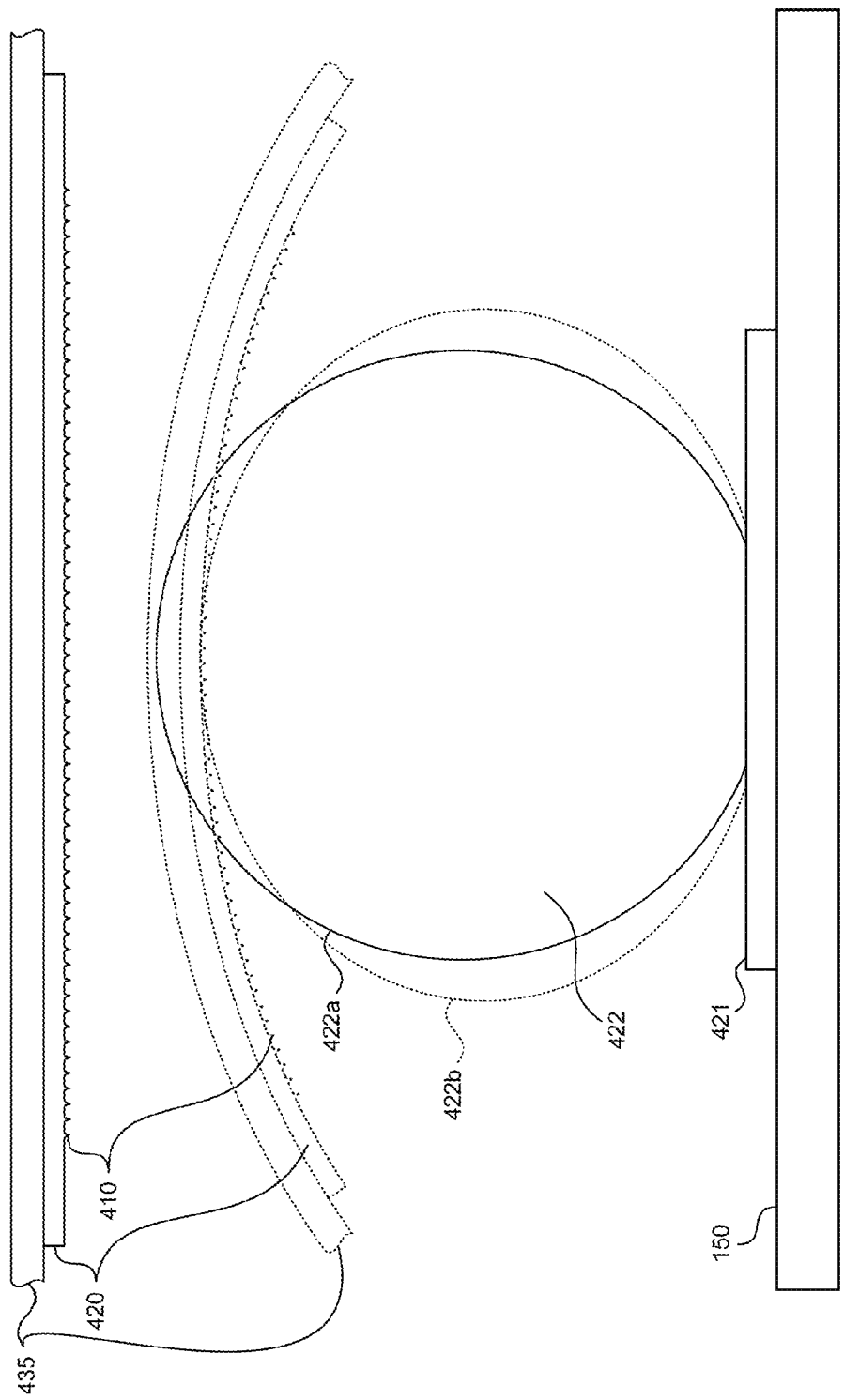
FIG. 25 is a partially schematic diagram of reshaping a solderball using a nanospike-based contactor in accordance with the present technology.

FIG. 25 illustrates a solderball 422 prior to reshaping (422a) and after reshaping (422b) in accordance with an embodiment of the present technology. The non-roundness of the shape of the solderball 422a is exaggerated for the purposes of illustration. In a more common situation, however, a non-roundness or an excessive height of the solderball 422a can be relatively small and can be corrected with pressure from the contactor stack 435/420/410. The contactor stack is drawn in solid lines prior to contacting the solderball, and in dashed lines when in contact with the solderball. In some embodiments, the contactor stack may bend when pressing against the solderball. The relatively small scale and high number of the nanospikes 410 in contact with the solderball 422 can prevent damage to the solderball during the process of reshaping the solderball. In some embodiments, both the excessive height and the non-roundness of the solderball may be corrected using the contactor stack 435/420/410.

Figure 26A:
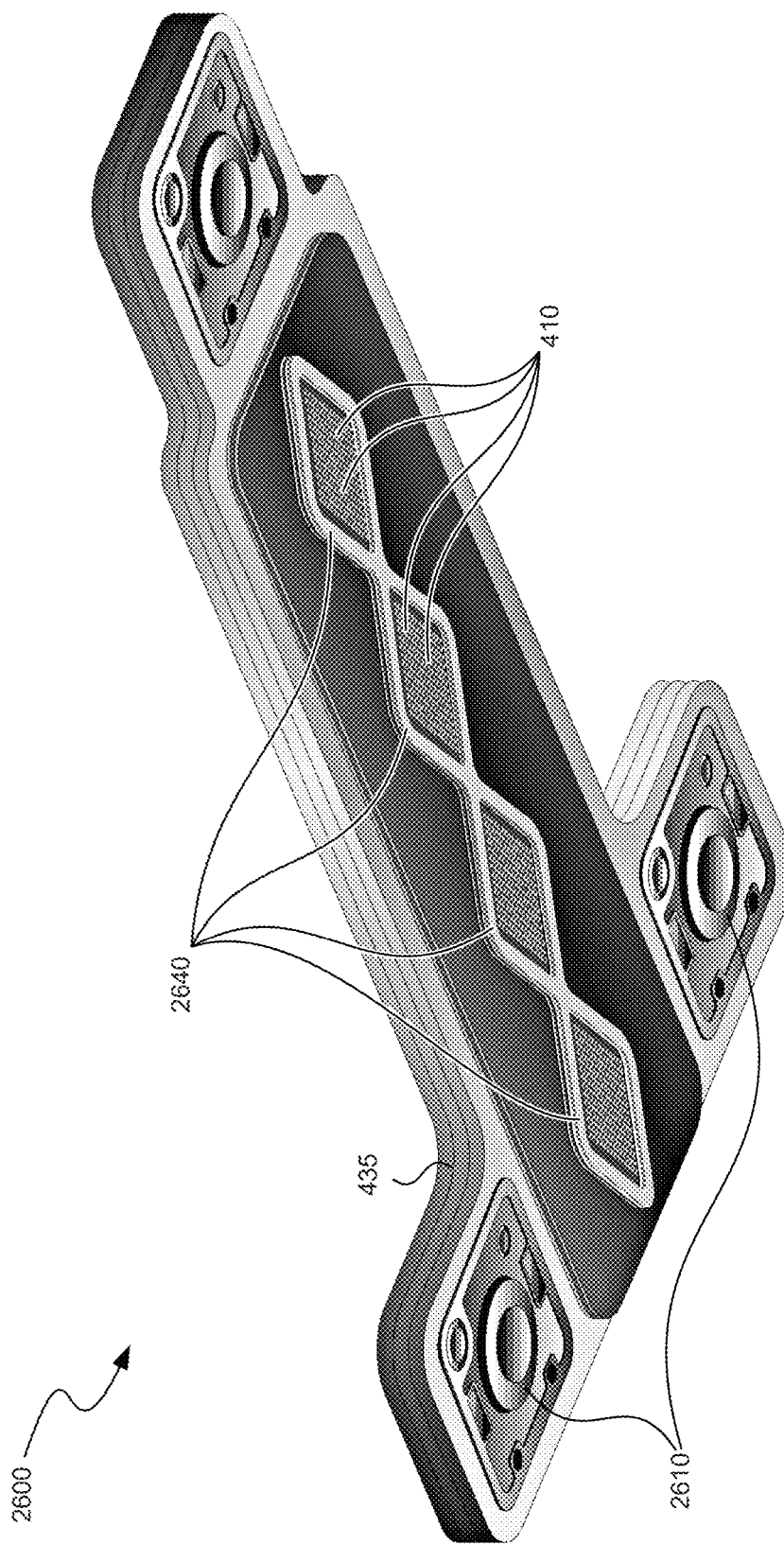

FIGS. 26A-26C illustrate several views of a reshaping translator 2600 suitable for testing a device under test and for reshaping the solderballs of the device under test. FIG. 26A is a bottom isometric view of the reshaping translator 2600 that can both test the dies and reshape the solderballs. Accordingly, the reshaping translator 2600 can have a smaller size/pitch contacts on its wafer side and a larger size/pitch contacts on its inquiry side. FIG. 26A illustrates a bottom view of the reshaping translator 2600 having four die contactors 2640. The reshaping translators 2600 with a bigger or smaller number of the die contactors 2640 are also possible. The reshaping translator 2600 can include several die contactors 2640, the number depending on the number of dies whose solderballs are reshaped/tested in parallel. The die contactors 2640 include nanospikes 410 distributed over the nanospike pads 420 (not visible). The die contactors 2640 can be carried by a translator board 435. In some embodiments, the reshaping translator 2600 includes force actuators 2610 that can align and press the translator board 435 against the semiconductor wafer. For example, three force actuators 2610 can be used to align the reshaping translator 2600 against a semiconductor wafer in the proper plane. The force actuators can be piezoelectric, pneumatic, hydraulic, or other suitable force actuators.

FIG. 26B is a top isometric view of the reshaping translator 2600 having the inquiry side contact pads 460 with a bigger size/pitch than the contact pads on the wafer side of the translator. In at least some embodiment of the technology, the force actuators 2610 can be located at the inquiry side of the reshaping translator 2600. FIG. 26C is a side view of the reshaping translator 2600 that is aligned and spaced apart from the wafer 150. For the sake of clarity of the illustration, the reshaping translator 2600 suitable for reshaping/testing one die is shown, but the reshaping translators capable of addressing multiple dies are also possible. In operation, the reshaping translator can be pressed against the solderballs 422 of the die to reshape them. The reshaping translator 2600 can also electrically connect the device under the test to the tester for testing the device prior, during, or after reshaping the solderballs. After the reshaping and/or testing of the die is finished, the reshaping translator 2600 can step to the next die.

In some embodiments, the translator board 435 can have a wafer side facing the die, an inquiry side facing away from the wafer side, a plurality of wafer side contact pads 460 carried by the board at the wafer side of the package, and a plurality of nanospikes 410 carried by at least one wafer side contact pad. In general, the plurality of wafer side contact pads corresponds to a plurality of solderballs 422 of a die on a wafer. The reshaping translator 2600 can further have the force actuators 2610 configured to provide forces that produce contact between the contact sites 2640 of the board and the corresponding solderballs 422 of the die, thus reshaping the solderballs 422. In some embodiments, the solderballs 422 of a die on a wafer can be reshaped by positioning a reshaping translator 2600 proximate to the solderballs 422 of the die. The reshaping translator 2600 can have a first side facing the solderballs 422, and a second side facing away from the first side. The first side can carry a plurality of contact pads 460, and at least one contact pad 460 can carry a plurality of nanospikes 410. The reshaping translator 2600 can contact one or more solderballs 422 of the die with the contact pads 460. The solderballs 422 of the die can reshape under the pressure of the contact pads 460. Furthermore, the die can be electrically connected via the reshaping translator to a tester to test the die. The contact pads 460 carried by the first side of the reshaping translator 2600 can be smaller than the contact pads carried by the second side of the reshaping translator.

From the foregoing, it will be appreciated that specific embodiments of the technology have been described herein for purposes of illustration, but that various modifications may be made without deviating from the disclosure. For example, in some embodiments, the nanospikes can be made by chemical etching, in addition to or in lieu of an additive process. The etching process may start by attaching wires having diameter of several microns to a metal substrate. Next, the substrate can be inverted and the wires repeatedly exposed to a chemical etchant by, for example, dipping the wires into an etchant pool. Because the etchant drains along the length of the wires, the tips of the wires tend to etch more than the bases of the wires, thus producing tapered (e.g., pointy) cones. The process can stop when the desired size of the nanospikes is achieved. In other embodiments, nanospikes having different sizes and/or shapes can be configured on a nanospike pad. Furthermore, in some embodiments of present technology, the nanospike pads 420 can be carried by the interposer board 130, which can directly contact the device under test, without the intermediate translator. The test stackup without the translator may be particularly applicable in cases for which the contact structures of the device under test are relatively large, thus not requiring a translator having smaller wafer side pads and larger inquiry side pads. In some embodiments of the present technology, the nanospikes can be made by applying a metal coating over a plastic substrate. Even a relatively small thickness of the metal coating can result in an acceptably low overall contact resistance because of the large surface area of the nanospikes in contact with the device under test. In some embodiments, the tip of the nanospikes can be planarized to create blunted nanospikes that may be more resistant to tip breakage. In some other embodiments, nanospikes of different sizes can be used on the same contactor. Furthermore, larger nanospikes can carry smaller nanospikes on the side surfaces to, for example, decrease contact resistance by further increasing the contact area. Furthermore, the smaller nanospikes can have different mechanical/electrical properties than the larger nanospikes. In some embodiments, the nanospikes can be used for contacting biological material, for example, tissue cells. The size of the nanospikes can generally correspond to the size of tissue cell or elements of the cell, for example proteins.

Moreover, while various advantages and features associated with certain embodiments have been described above in the context of those embodiments, other embodiments may also exhibit such advantages and/or features, and not all embodiments need necessarily exhibit such advantages and/ or features to fall within the scope of the technology. Accordingly, the disclosure can encompass other embodiments not expressly shown or described herein.

We claim:

1. An apparatus for testing and packaging semiconductor dies, comprising:
   a package having a wafer side positionable to face toward a device under test, and an inquiry side facing away from the wafer side, wherein the package is suitable for packaging the device under test to create a tested packaged die;
   a plurality of wafer side nanospike pads carried by the package at the wafer side of the package; and
   a plurality of nanospikes carried by the nanospike pads of the package, wherein individual nanospike pads each carry multiple nanospikes, wherein individual nanospikes project directly from the nanospike pads, wherein the nanospikes form an intermetallic bond with solderballs of the device under test, wherein intermetallic bonds are formed by melting and resolidifying to form a tested packaged die that successfully passed a test using signals and power from a tester, and wherein the intermetallic bonds comprise nanospike material diffused into contact structures of the tested packaged die.

2. The apparatus of claim 1 wherein the nanospikes comprise layers of Ni and Al capable of reacting exothermically.

3. The apparatus of claim 1 wherein the nanospikes comprise a core material and a cover material.

4. The apparatus of claim 1 wherein the nanospikes are approximately 0.3-2 μm long.

5. The apparatus of claim 1 wherein the nanospikes are arranged in a grid with a spacing of approximately 0.3-2 μm from one nanospike to another.

6. A tested and packaged semiconductor die, comprising:
   a die having a first active side and a second side facing away from the active side, and a plurality of contact structures carried by the active side; and
   a package having a wafer side facing the die, an inquiry side facing away from the wafer side, and a plurality of wafer side nanospike pads carried by the package at the wafer side of the package, and a plurality of nanospikes carried by the nanospike pads of the package, wherein individual nanospike pads of the package each carry multiple nanospikes, wherein individual nanospikes project directly from the nanospike pads, wherein the nanospikes are connected to the contact structures of the die by intermetallic bonds formed by melting and resolidifying to form a tested packaged device tested with signals and power from a tester, wherein the tested and packaged semiconductor die includes the die intermetallicaly bonded to the nanospikes of the package, and wherein the intermetallic bonds comprise nanospike material diffused into the contact structures.

7. The apparatus of claim 6 wherein the nanospikes comprise materials capable of an exothermic reaction.

8. The apparatus of claim 6, further comprising underfill material between the package and the die.

9. The apparatus of claim 6 wherein the nanospikes are approximately 0.3-2 μm long.

10. A method for testing and packaging a device under test, comprising: placing the device under test to face a package, wherein the device under test is a die of a semiconductor wafer, wherein the device under test carries a plurality of contact structures, wherein the package has a wafer side with a plurality of nanospike pads facing the device under test and an inquiry side facing away from the wafer side, wherein nanospikes are carried by the nanospike pads of the package, wherein individual nanospike pads of the package each carry multiple nanospikes, wherein individual nanospikes project directly from the nanospike pads, and wherein the nanospikes face the device under test, and wherein the package is suitable for packaging the device under test to create a tested packaged die; and contacting one or more contact structures of the device under test with the nanospikes of the package; testing the device under test using signals and power from a tester; and after successfully testing the device under test, forming intermetallic bonds between at least some nanospikes and corresponding contact structures by melting and resolidifying to form the tested packaged die, wherein the intermetallic bonds comprise nanospike material diffused into the contact structures.

11. The method of claim 10, further comprising:
    positioning a socket to face the inquiry side of the package, wherein the socket has a first side facing the package and a second side facing away from the first side; and
    contacting the inquiry side of the package with the first side of the socket.

12. The method of claim 10 wherein forming intermetallic bonds comprises heating at least some nanospikes and contact structures.

13. The method of claim 10, further comprising:
    singulating the device under the test from the wafer to form a packaged known good die.

14. The method of claim 10, further comprising:
    disposing an underfill material proximate to contact structures of the device under test;
    after successfully testing the device under test, activating the underfill material by heating; and
    distributing the underfill material between the device under test and the package based on a surface tension of the underfill material.

15. An apparatus for testing and packaging semiconductor dies, comprising: a package having a wafer side positionable to face toward a device under test, and an inquiry side facing away from the wafer side, wherein the package is suitable for packaging a semiconductor die to create a tested packaged die; a plurality of wafer side nanospike pads carried by the package at the wafer side of the package; and a plurality of designed asperities carried by the nanospike pads of the package, wherein individual nanospike pads each carry multiple design asperities, wherein individual asperities project directly from the nanospike pads, wherein the asperities are positioned to form an intermetallic bond by melting and resolidifying with solderballs of the device under test that successfully passed a test using signals and power from a tester, and wherein the intermetallic bonds comprise asperities material diffused into contact structures of the tested packaged die.

16. A method for testing and packaging a device under test, comprising: placing the device under test to face a package, wherein the device under test carries a plurality of contact structures, wherein the package has a wafer side with a plurality of nanospike pads facing the device under test and an inquiry side facing away from the wafer side, wherein individual nanospike pads of the package each carry multiple nanospikes, wherein individual nanospikes project directly from the nanospike pads, wherein the nanospikes face the device under test, and wherein the package is suitable for packaging the device under test to create a tested packaged die; and contacting one or more contact structures of the device under test with the nanospikes of the package; testing the device under test using signals and power from a tester; and after successfully testing the device under test, forming intermetallic bonds by melting and resolidifying between at least some nanospikes and corresponding contact structures to form the tested packaged die, wherein the intermetallic bonds comprise nanospike material diffused into the contact structures.

* * * * *